US012603139B2

(12) United States Patent
Yuan et al.

(10) Patent No.: US 12,603,139 B2
(45) Date of Patent: Apr. 14, 2026

(54) NON-VOLATILE MEMORY WITH HIGH PERFORMANCE READ

(71) Applicant: Sandisk Technologies, Inc., Milpitas, CA (US)

(72) Inventors: Jiahui Yuan, Fremont, CA (US); Jiacen Guo, Sunnyvale, CA (US); Deepanshu Dutta, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 189 days.

(21) Appl. No.: 18/362,509

(22) Filed: Jul. 31, 2023

(65) Prior Publication Data

US 2025/0046386 A1 Feb. 6, 2025

(51) Int. Cl.
*G11C 16/08* (2006.01)
*G11C 16/34* (2006.01)
(52) U.S. Cl.
CPC .......... *G11C 16/3459* (2013.01); *G11C 16/08* (2013.01)
(58) Field of Classification Search
CPC ................................................ G11C 16/3459
See application file for complete search history.

(56) References Cited

U.S. PATENT DOCUMENTS

| | | | |
|---|---|---|---|
| 7,436,733 B2 | 10/2008 | Mokhlesi | |
| 9,336,891 B2 | 5/2016 | Yuan et al. | |
| 9,443,606 B2 | 9/2016 | Dutta et al. | |
| 11,024,393 B1 * | 6/2021 | Zhang | G11C 16/0483 |
| 2021/0065819 A1 * | 3/2021 | Choi | G11C 29/42 |
| 2024/0282387 A1 * | 8/2024 | Park | G11C 16/32 |

* cited by examiner

*Primary Examiner* — Douglas King
(74) *Attorney, Agent, or Firm* — PEARL COHEN ZEDEK LATZER BARATZ LLP

(57) ABSTRACT

When performing a read process, a non-volatile memory first performs a pre-read sensing of the condition of memory cells connected to neighbor word lines. While applying a first word line voltage associated with a first programmed data state to the selected word line, the memory system performs two sensing operations for the first programmed data state on selected memory cells that have neighbor memory cells on the neighbor word lines in a first condition and perform two sensing operations for the first programmed data state on selected memory cells that have neighbor memory cells on the neighbor word lines in a second condition. Based on that sensing, the data being stored in the set of selected memory cells is determined. In some embodiments, at least one of the two sensing operations for each condition includes sensing soft bit information that improves the data decoding process.

19 Claims, 24 Drawing Sheets

Figure 6A

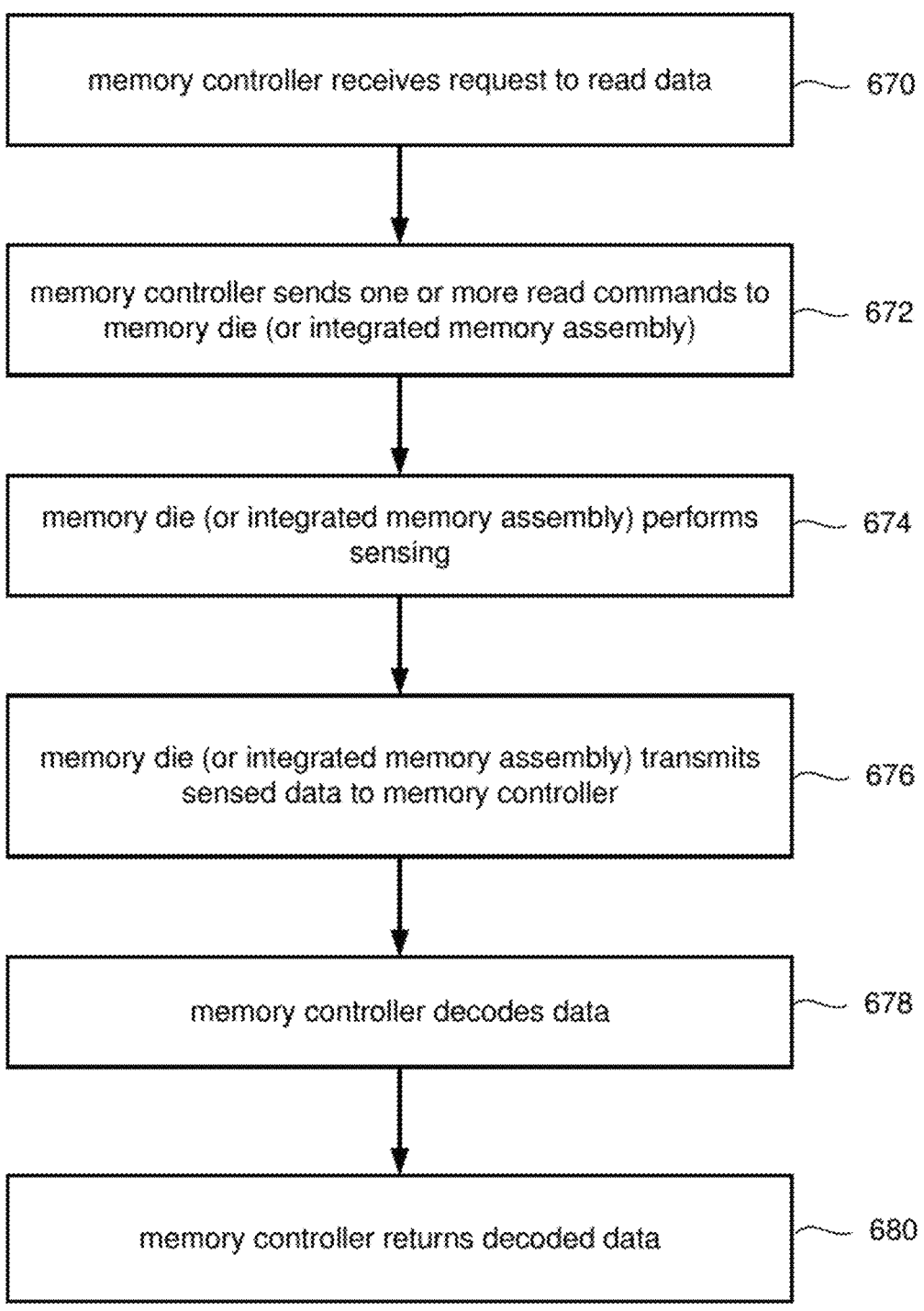

memory controller receives request to read data — 670 memory controller sends one or more read commands to memory die (or integrated memory assembly) — 672 memory die (or integrated memory assembly) performs sensing — 674 memory die (or integrated memory assembly) transmits sensed data to memory controller — 676 memory controller decodes data — 678 memory controller returns decoded data — 680

BLS     Vdd

BLC

FLA     Vbl+Vsrc+Vth     Vdd

H00     Vhoo

X00     Vblc+Vblx

FCO     Vdd

STRO     Vdd

CLK     Vblx     Vss

SEN     Vpre     Vpost_con

A     Vdd     Vss t0   t1   t2   t3   t4   t5   t6   t7   t8   t9   t10 sense time of memory cells

B     C

VrC-   VrC+

VrC

Vt

Figure 10 perform a single pre-read sensing operation to determine conditions of neighbor memory cells connected to neighbor word lines, the neighbor word lines are adjacent to a selected word line, a set of selected memory cells are connected to the selected word line, the single pre-read sensing operation identifies whether each neighbor memory cell is in a low threshold voltage data state or a high threshold voltage data state  — 1002 classify each selected memory cell of the set of selected memory cells connected to a selected word line into a category of a set of two or more categories based on condition of one or more respective neighbor memory cells (e.g., classify selected memory cells of the set of selected memory cells into a first category if two respective neighbor memory cells are identified to be in the low threshold voltage data state, the control circuit is configured to classify selected memory cells of the set of selected memory cells into a second category if at least one respective neighbor memory cell is identified to be in the high threshold voltage data state)  — 1004 apply a first word line voltage to the selected word line  — 1006 perform two sensing operations for each category of the set of two or more categories in response to the first word line voltage applied to the selected word line in order to read the set of selected memory cells such that each selected memory cell is sensed two different times, selected memory cells classified into a same category are sensed at a same time and selected memory cells classified into different categories are sensed at one or more different times in response to the first word line voltage applied to the selected word line  — 1008

Figure 13

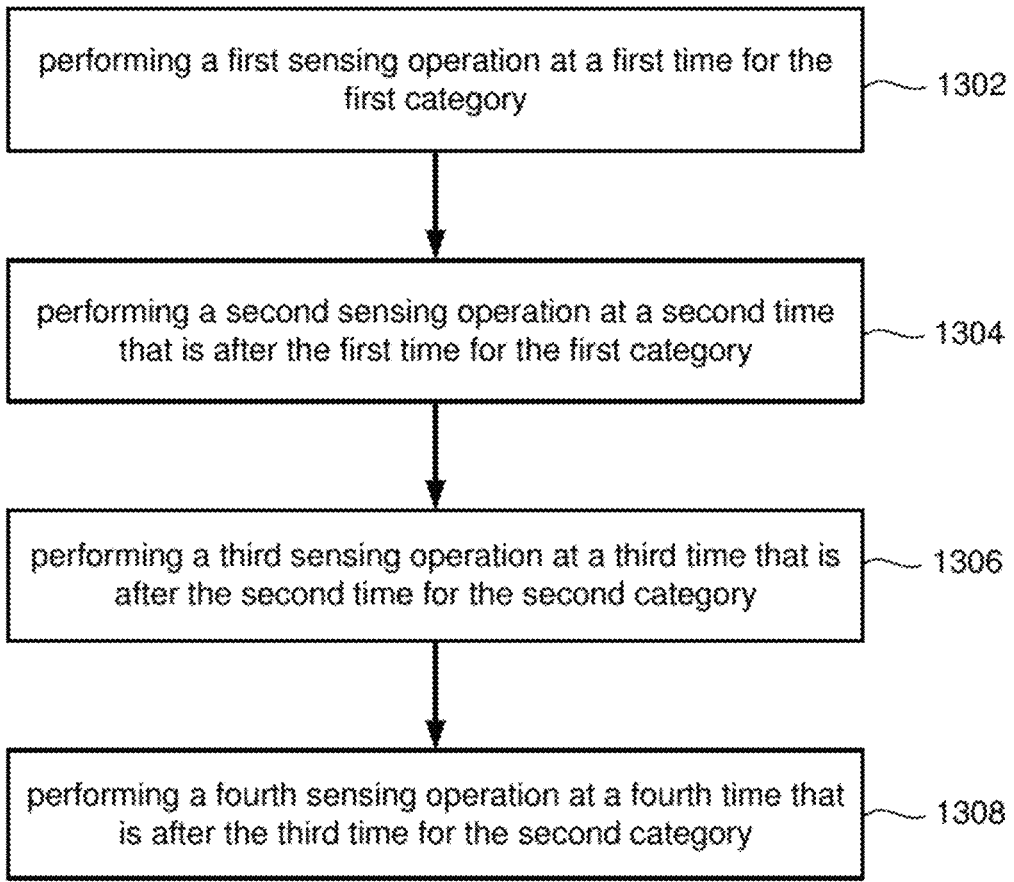

performing a first sensing operation at a first time for the first category ~ 1302 performing a second sensing operation at a second time that is after the first time for the first category ~ 1304 performing a third sensing operation at a third time that is after the second time for the second category ~ 1306 performing a fourth sensing operation at a fourth time that is after the third time for the second category ~ 1308

NON-VOLATILE MEMORY WITH HIGH PERFORMANCE READ

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Users of non-volatile memory can program (e.g., write) data to the non-volatile memory and later read that data back. For example, a digital camera may take a photograph and store the photograph in non-volatile memory. Later, a user of the digital camera may view the photograph by having the digital camera read the photograph from the non-volatile memory. Because users often rely on the data they store, it is important to users of non-volatile memory to be able to store data reliably so that it can be read back successfully.

For some memory systems, such as a Solid State Drive or other system, the read process can be performed more reliably by taking into account the data being stored in other memory cells adjacent to the memory cells being read (e.g., on neighbor word lines). However, previous attempts to increase reliability by taking into account the data being stored in other memory cells adjacent to the memory cells being read have resulted in read processes that are slower than desired.

BRIEF DESCRIPTION OF THE DRAWINGS

Like-numbered elements refer to common components in the different figures.

FIG. 6A is a flow chart describing one embodiment of a process for reading non-volatile memory.

FIG. 10 is a flow chart describing one embodiment of a process for reading non-volatile memory.

FIG. 13 is a flow chart describing one embodiment of a process for sensing at different sense times.

DETAILED DESCRIPTION

When performing a read process, a non-volatile memory first performs a pre-read sensing of the condition of memory cells connected to neighbor word lines. While applying a first word line voltage associated with a first programmed data state to the selected word line, the memory system performs two sensing operations for the first programmed data state on selected memory cells that have neighbor memory cells on the neighbor word lines in a first condition and perform two sensing operations for the first programmed data state on selected memory cells that have neighbor memory cells on the neighbor word lines in a second condition. Based on that sensing, the data being stored in the set of selected memory cells is determined. In some embodiments, at least one of the two sensing operations for each condition includes sensing soft bit information that improves the data decoding process.

This technology effectively provides a multi-strobe sensing process that adjusts the sense time for both compensation for neighbor memory cell threshold voltage and for soft bit information. The result is a highly accurate read process without unreasonably elongating the time needed to complete the read process.

Figure 1:
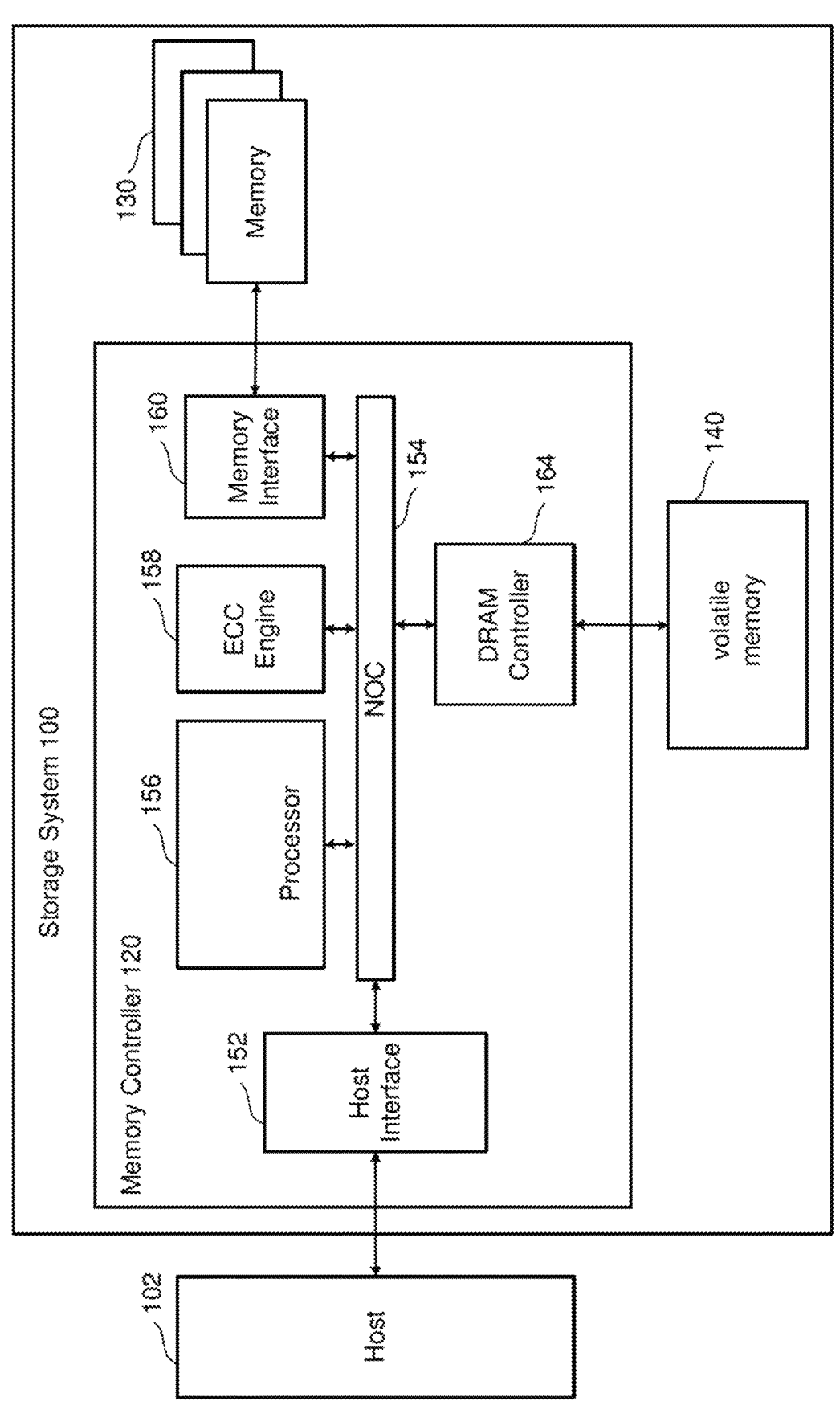
FIG. 1 is a block diagram depicting one embodiment of a storage system.

FIG. 1 is a block diagram of one embodiment of a storage system 100 that implements the proposed technology described herein. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e., the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
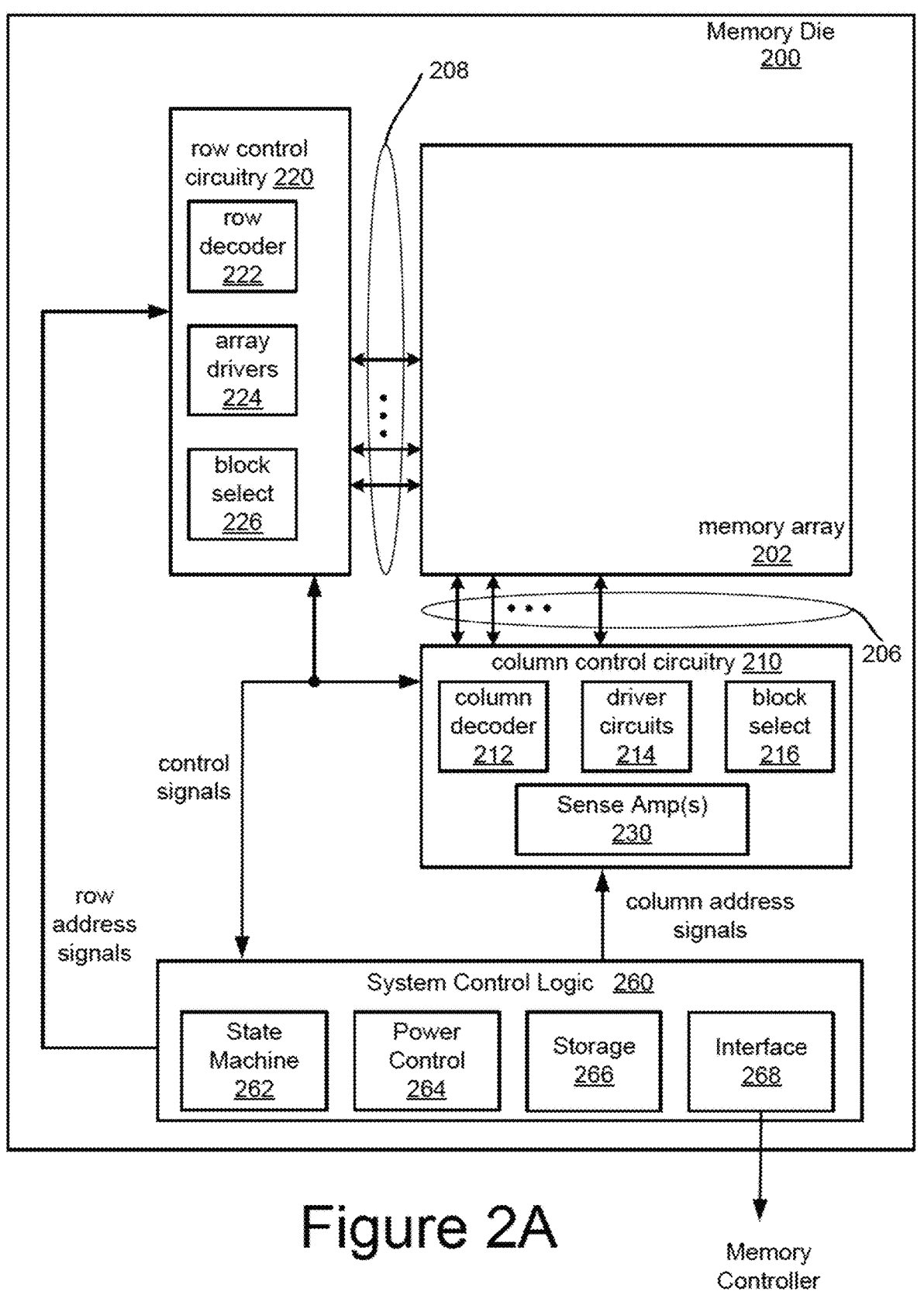
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprises non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 260, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 262 can also include a power control module 264 that controls the power and voltages supplied to the rows and columns of the memory structure 202 during memory operations and may include charge pumps and regulator circuit for creating regulating voltages. System control logic 262 includes storage 366

(e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 302 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or another wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
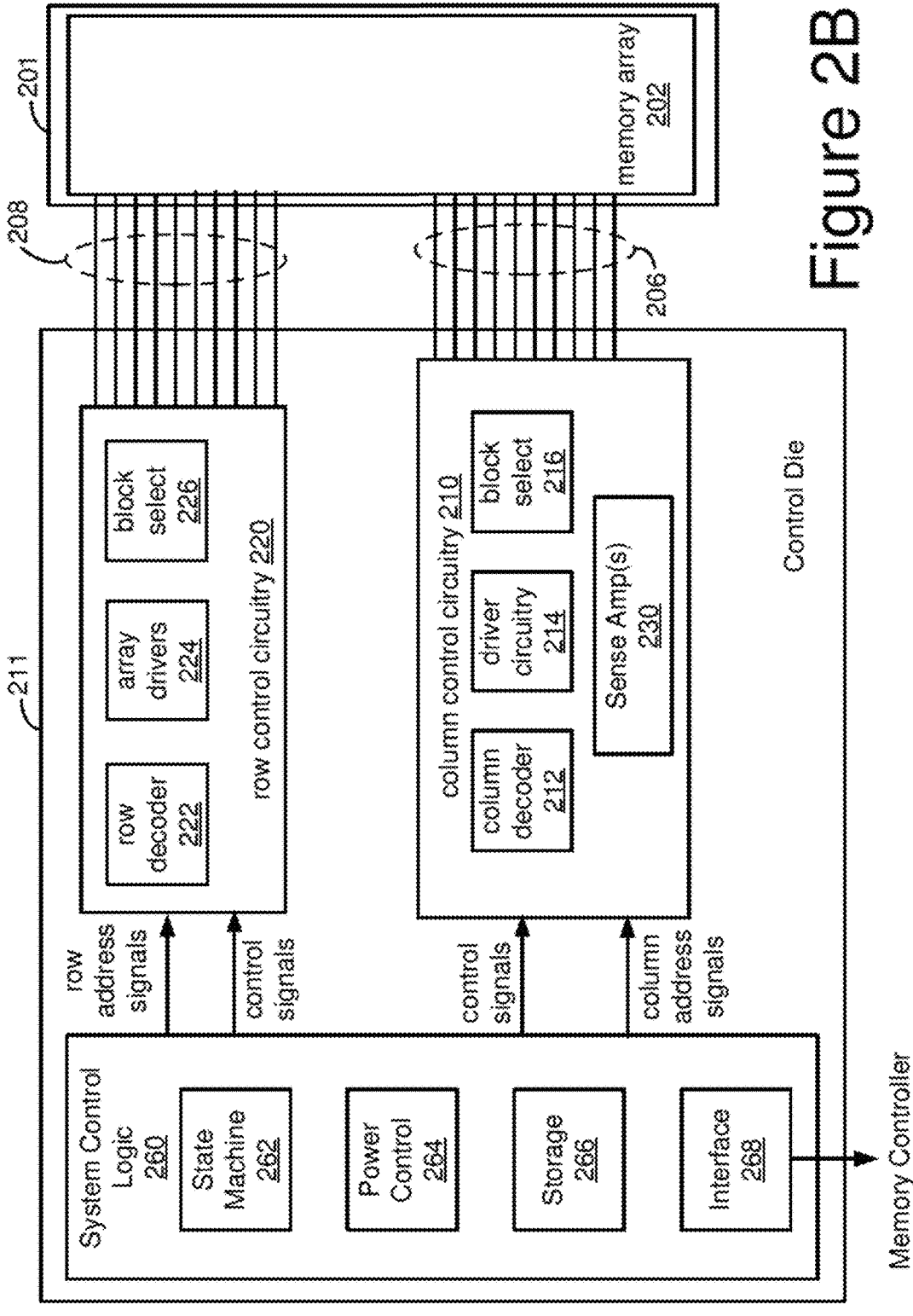
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 207 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 211 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory 2 die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 3A:
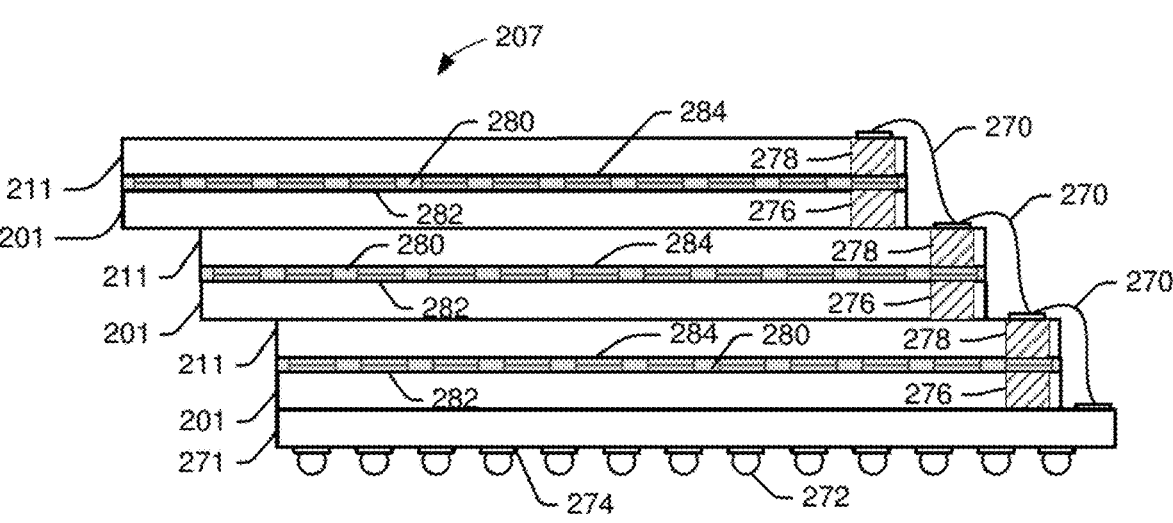
FIGS. 3A and 3B depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 3A depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
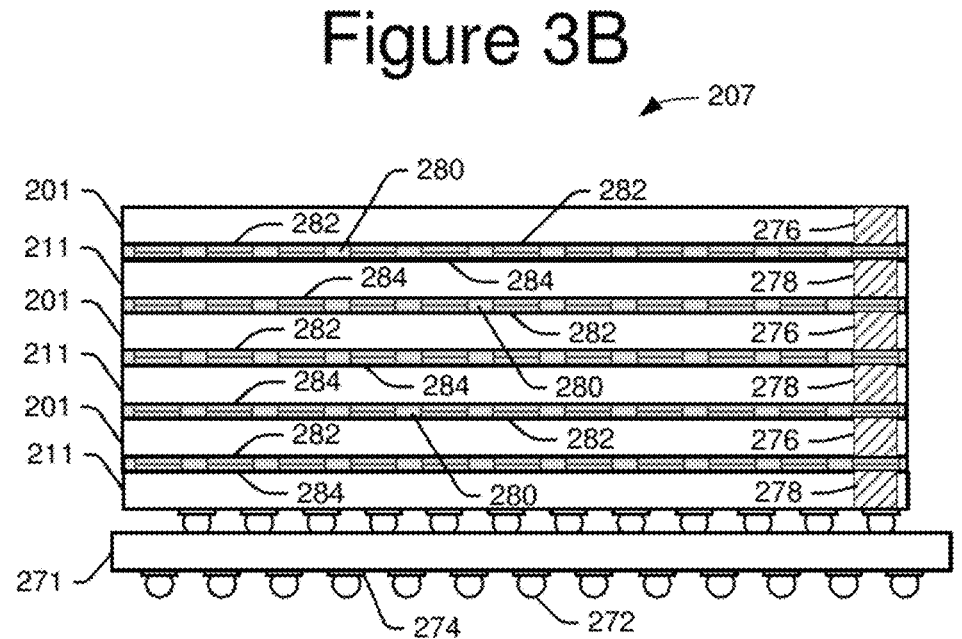

FIG. 3B depicts a side view of another embodiment of an integrated memory assembly 207 stacked on a substrate 271. The integrated memory assembly 207 of FIG. 3B has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller (or greater) sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 4:
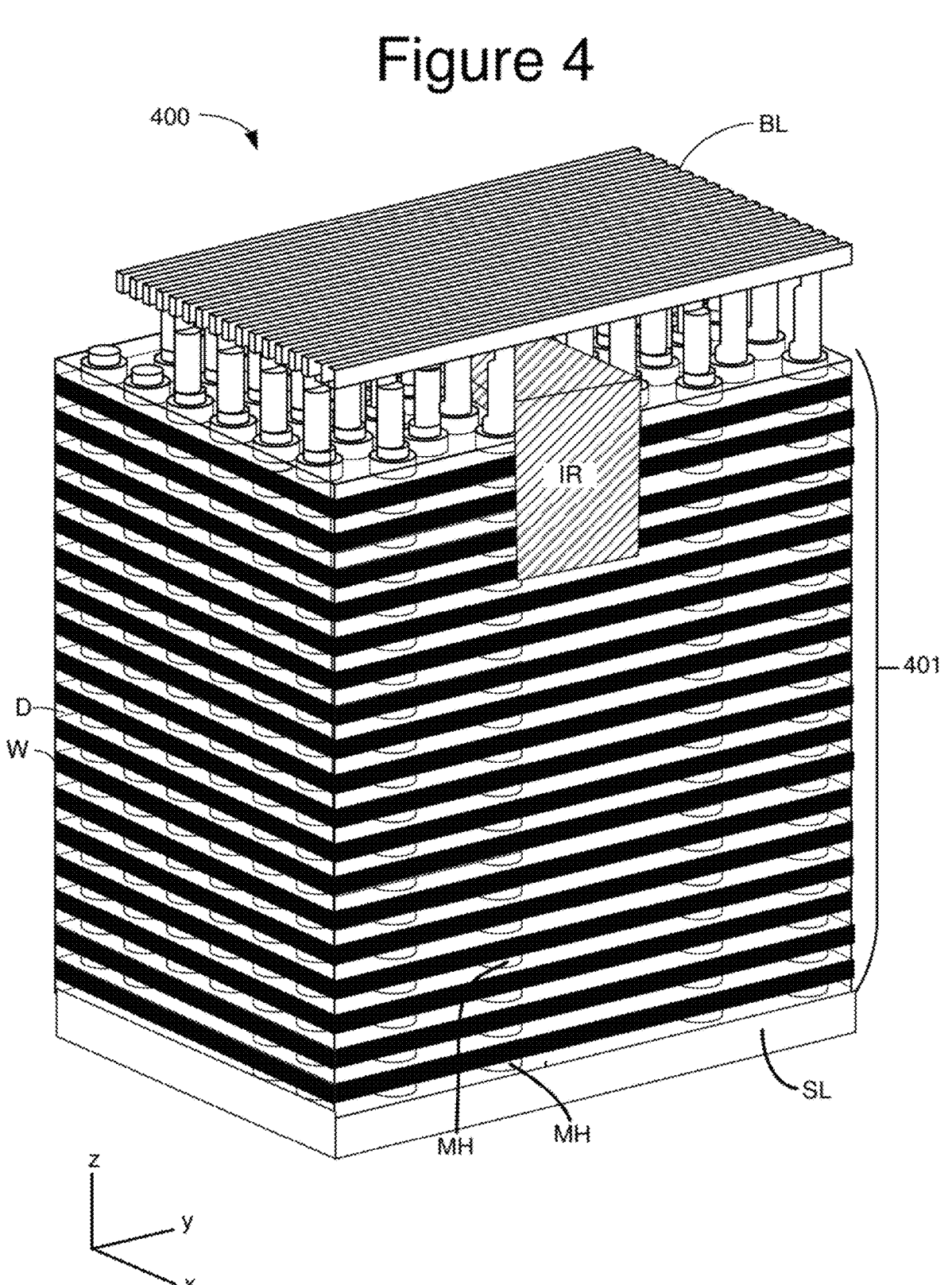
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into four or five (or a different number of) regions by isolation regions IR. FIG. 4 shows one isolation region IR separating two regions. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. Thus, the non-volatile memory cells are arranged in memory holes. More details of the three dimensional monolithic memory array that comprises memory structure 202 is provided below.

Figure 4A:
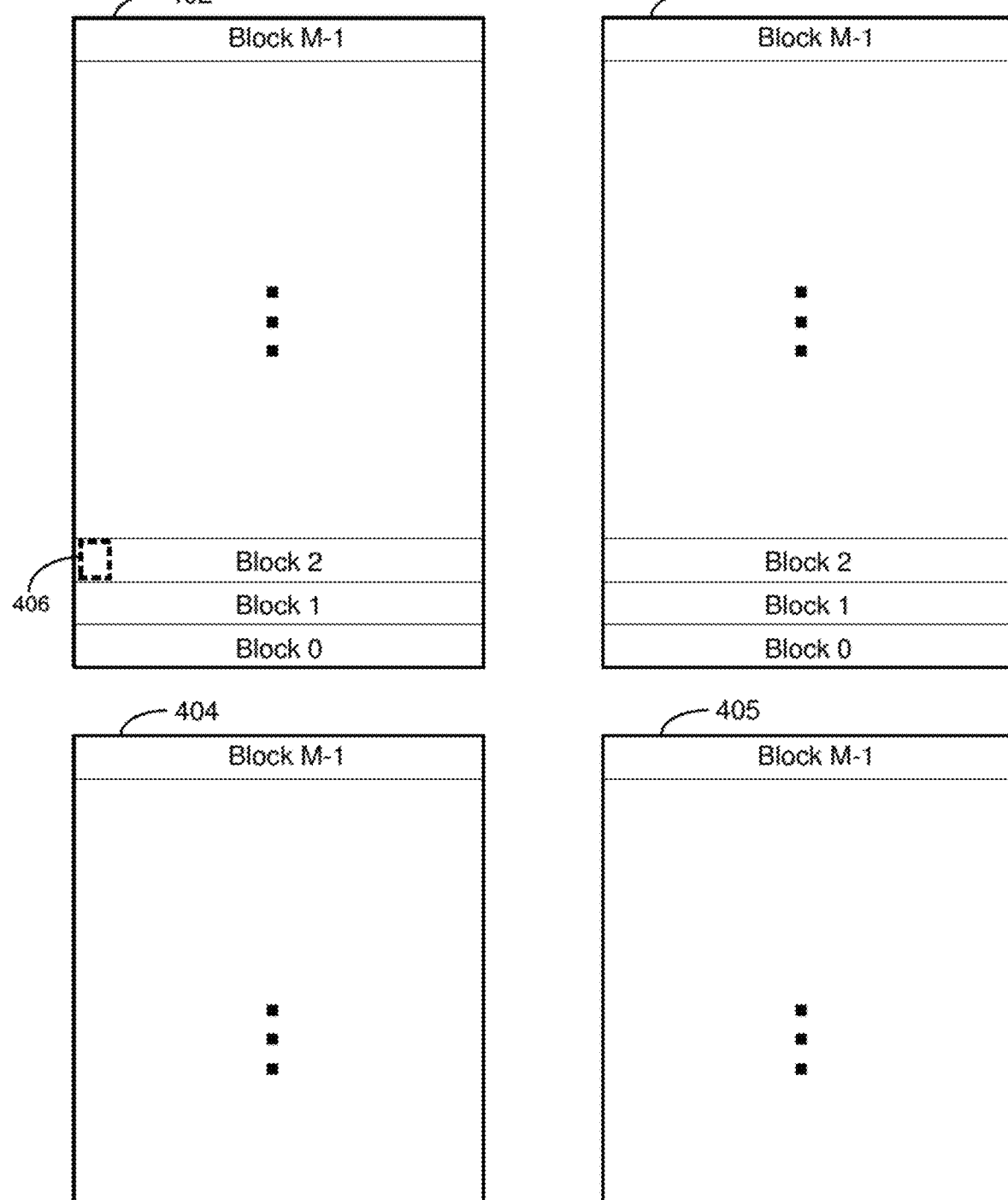
FIG. 4A is a block diagram of one embodiment of a memory structure having two planes.

FIG. 4A is a block diagram explaining one example organization of memory structure 202, which is divided into four planes 402, 403, 404 and 405. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows four planes, more or less than four planes can be implemented. In some embodiments, memory structure 202 includes eight planes.

Figure 4B:
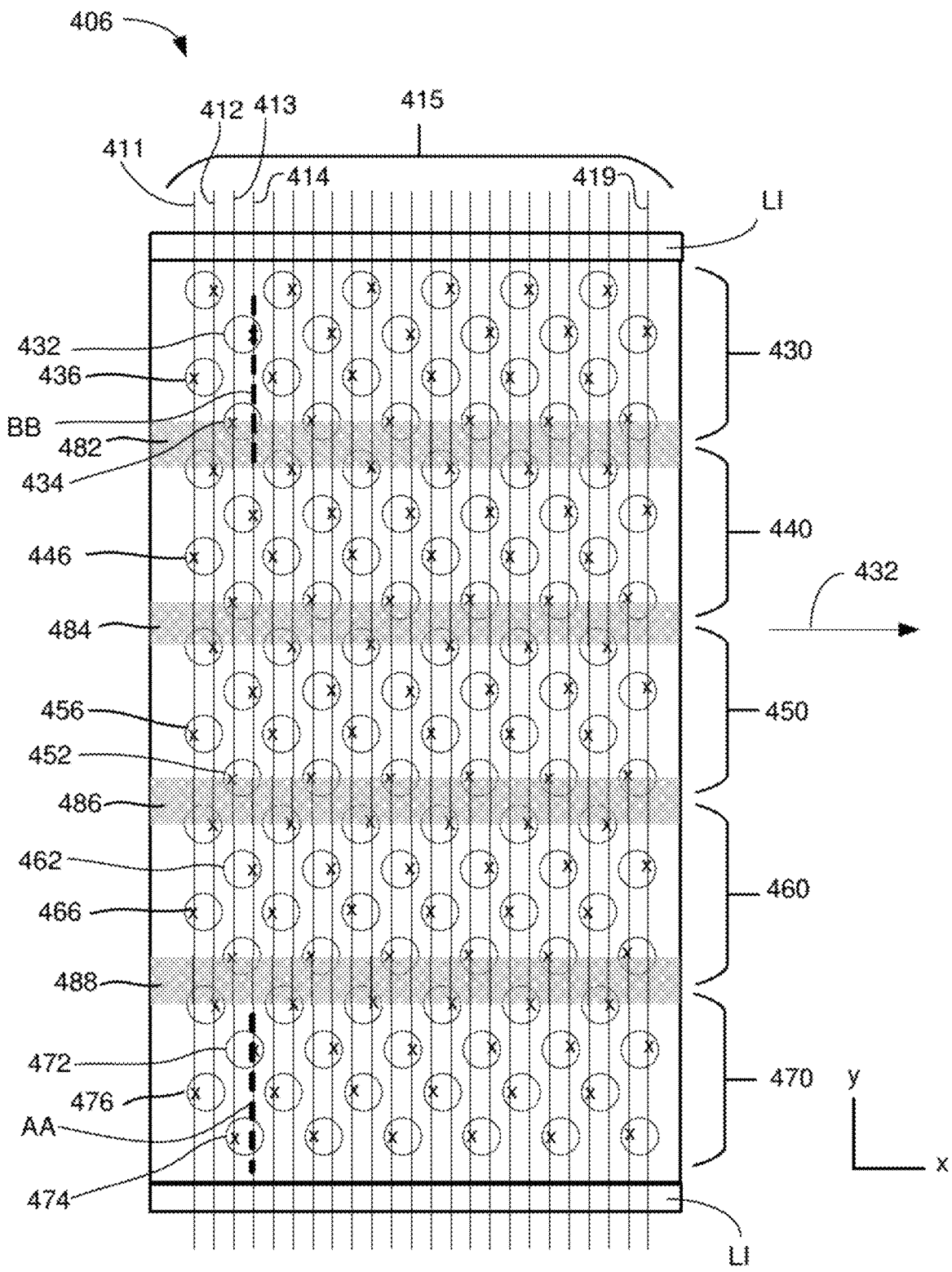
FIG. 4B depicts a top view of a portion of one embodiment of a block of memory cells.

FIGS. 4B-4G depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the memory holes, which are also referred to as vertical columns. Each of the memory holes/vertical columns include multiple select transistors (also referred to as a select gate or selection gate) and multiple memory cells. In one embodiment, each memory hole/vertical column implements a NAND string. For example, FIG. 4B labels a subset of the memory holes/vertical columns/NAND strings 432, 436, 446, 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to memory holes/vertical columns of the block. Each of the circles representing memory holes/vertical columns has an "x" to indicate its connection to one bit line. For example, bit line 411 is connected to memory holes/vertical columns 436, 446, 456, 466 and 476.

The block depicted in FIG. 4B includes a set of isolation regions 482, 484, 486 and 488, which are formed of SiO$_2$; however, other dielectric materials can also be used. Isolation regions 482, 484, 486 and 488 serve to divide the top layers of the block into five regions; for example, the top layer depicted in FIG. 4B is divided into regions 430, 440, 450, 460 and 470. In one embodiment, the isolation regions only divide the layers used to implement select gates so that NAND strings in different regions can be independently selected. In one example implementation, a bit line connects to one memory hole/vertical column/NAND string in each of regions 430, 440, 450, 460 and 470. In that implementation, each block has twenty four rows of active columns and each bit line connects to five rows in each block. In one embodiment, all of the five memory holes/vertical columns/NAND strings connected to a common bit line are connected to the same set of word lines; therefore, the system uses the drain side selection lines to choose one (or another subset) of the five to be subjected to a memory operation (program, verify, read, and/or erase).

FIG. 4B also shows Line Interconnects LI, which are metal connections to the source line SL from above the memory array. Line Interconnects LI are positioned adjacent regions 430 and 470.

Although FIG. 4B shows each region 430, 440, 450, 460 and 470 having four rows of memory holes/vertical columns, five regions and twenty four rows of memory holes/vertical columns in a block, those exact numbers are an example implementation. Other embodiments may include more or less regions per block, more or less rows of memory holes/vertical columns per region and more or less rows of vertical columns per block. FIG. 4B also shows the memory holes/vertical columns being staggered. In other embodiments, different patterns of staggering can be used. In some embodiments, the memory holes/vertical columns are not staggered.

Figure 4C:
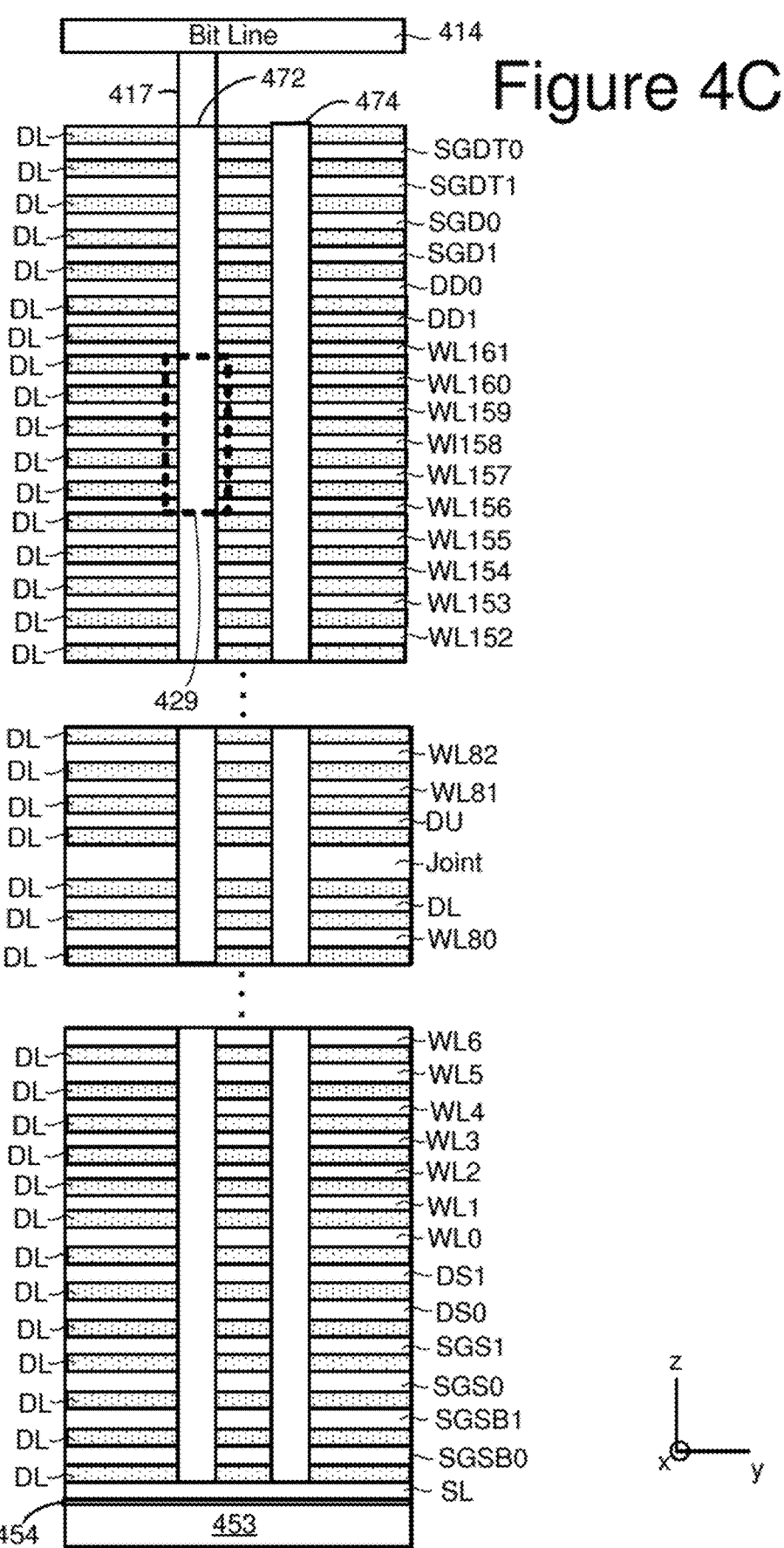
FIG. 4C depicts a cross sectional view of a portion of one embodiment of a block of memory cells.

FIG. 4C depicts a portion of one embodiment of a three dimensional memory structure 202 showing a cross-sectional view along line AA of FIG. 4B. This cross sectional view cuts through memory holes/vertical columns (NAND strings) 472 and 474 of region 470 (see FIG. 4B). The structure of FIG. 4C includes two drain side select layers SGD0 and SGD; two source side select layers SGS0 and SGS1; two drain side GIDL generation transistor layers SGDT0 and SGDT1; two source side GIDL generation transistor layers SGSB0 and SGSB1; two drain side dummy word line layers DD0 and DD1; two source side dummy word line layers DS0 and DS1; dummy word line layers DU and DL; one hundred and sixty two word line layers WL0-WL161 for connecting to data memory cells, and dielectric layers DL. Other embodiments can implement more or less than the numbers described above for FIG. 4C. In one embodiment, SGD0 and SGD1 are connected together; and SGS0 and SGS1 are connected together. In other embodiments, more or less number of SGDs (greater or lesser than two) are connected together, and more or less number of SGSs (greater or lesser than two) connected together.

In one embodiment, erasing the memory cells is performed using gate induced drain leakage (GIDL), which includes generating charge carriers at the GIDL generation transistors such that the carriers get injected into the charge trapping layers of the NAND strings to change threshold voltage of the memory cells. FIG. 4C shows two GIDL generation transistors at each end of the NAND string; however, in other embodiments there are more or less than three. Embodiments that use GIDL at both sides of the NAND string may have GIDL generation transistors at both sides. Embodiments that use GIDL at only the drain side of the NAND string may have GIDL generation transistors only at the drain side. Embodiments that use GIDL at only the source side of the NAND string may have GIDL generation transistors only at the source side.

FIG. 4C shows two GIDL generation transistors at each end of the NAND string. It is likely that charge carriers are only generated by GIDL at one of the two GIDL generation transistors at each end of the NAND string. Based on process variances during manufacturing, it is likely that one of the two GIDL generation transistors at an end of the NAND string is best suited for GIDL. For example, the GIDL generation transistors have an abrupt pn junction to generate the charge carriers for GIDL and, during fabrication, a phosphorous diffusion is performed at the polysilicon channel of the GIDL generation transistors. In some cases, the GIDL generation transistor with the shallowest phosphorous diffusion is the GIDL generation transistor that generates the charge carriers during erase. However, in some embodiments charge carriers can be generated by GIDL at multiple GIDL generation transistors at a particular side of the NAND string.

Memory holes/Vertical columns 472 and 474 are depicted protruding through the drain side select layers, source side select layers, dummy word line layers, GIDL generation transistor layers and word line layers. In one embodiment, each memory hole/vertical column comprises a vertical NAND string. Below the memory holes/vertical columns and the layers listed below is substrate 453, an insulating film 454 on the substrate, and source line SL. The NAND string of memory hole/vertical column 472 has a source end at a bottom of the stack and a drain end at a top of the stack. As in agreement with FIG. 4B, FIG. 4C show vertical memory hole/column 472 connected to bit line 414 via connector 417.

For ease of reference, drain side select layers; source side select layers, dummy word line layers, GIDL generation transistor layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten, metal silicide, such as nickel silicide, tungsten silicide, aluminum silicide or the combination thereof. In some embodiments, different conductive layers can be formed from different materials. Between conductive layers are dielectric layers DL. In one embodiment, the dielectric layers are made from $SiO_2$. In other embodiments, other dielectric materials can be used to form the dielectric layers.

The non-volatile memory cells are formed along memory holes/vertical columns which extend through alternating conductive and dielectric layers in the stack. In one embodiment, the memory cells are arranged in NAND strings. The word line layers WL0-W161 connect to memory cells (also called data memory cells). Dummy word line layers connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD0 and SGD1 are used to electrically connect and disconnect NAND strings from bit lines. Source side select layers SGS0 and SGS1 are used to electrically connect and disconnect NAND strings from the source line SL.

FIG. 4C shows that the memory array is implemented as a two tier architecture, with the tiers separated by a Joint area. In one embodiment it is expensive and/or challenging to etch so many word line layers intermixed with dielectric layers. To case this burden, one embodiment includes laying down a first stack of word line layers (e.g., WL0-WL80) alternating with dielectric layers, laying down the Joint area, and laying down a second stack of word line layers (e.g., WL81-WL161) alternating with dielectric layers. The Joint area are positioned between the first stack and the second stack. In one embodiment, the Joint areas are made from the same materials as the word line layers. In other embodiments, there can no Joint area or there can be multiple Joint areas.

Figure 4D:
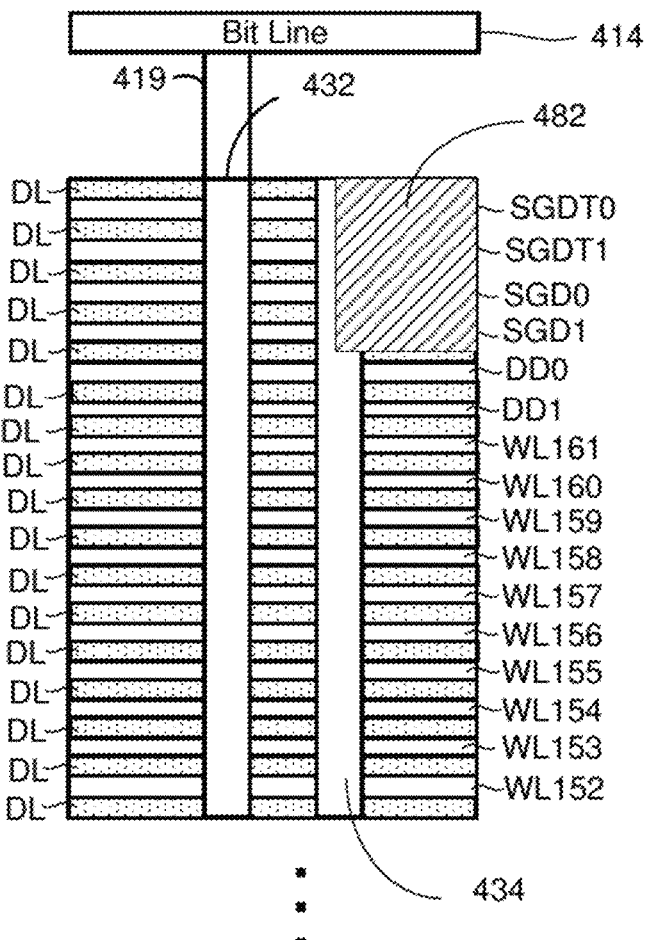
FIG. 4D depicts a cross sectional view of a portion of one embodiment of a block of memory cells.

FIG. 4D depicts a portion of one embodiment of a three dimensional memory structure 202 showing a cross-sectional view along line BB of FIG. 4B. This cross sectional view cuts through memory holes/vertical columns (NAND strings) 432 and 434 of region 430 (see FIG. 4B). FIG. 4D shows the same alternating conductive and dielectric layers as FIG. 4C. FIG. 4D also shows isolation region 482. Isolation regions 482, 484, 486 and 488) occupy space that would have been used for a portion of the memory holes/vertical columns/NAND stings. For example, isolation region 482 occupies space that would have been used for a portion of memory hole/vertical column 434. More specifically, a portion (e.g., half the diameter) of vertical column 434 has been removed in layers SGDT0, SGDT1, SGD0, and SGD1 to accommodate isolation region 482. Thus, while most of the vertical column 434 is cylindrical (with a circular cross section), the portion of vertical column 434 in layers SGDT0, SGDT1. SGD0, and SGD1 has a semi-circular cross section. In one embodiment, after the stack of alternating conductive and dielectric layers is formed, the stack is etched to create space for the isolation region and that space is then filled in with $SiO_2$. This structure allows for separate control of SGDT0, SGDT1, SGD0, and SGD1 for regions 430, 440, 450, 460, and 470.

Figure 4E:
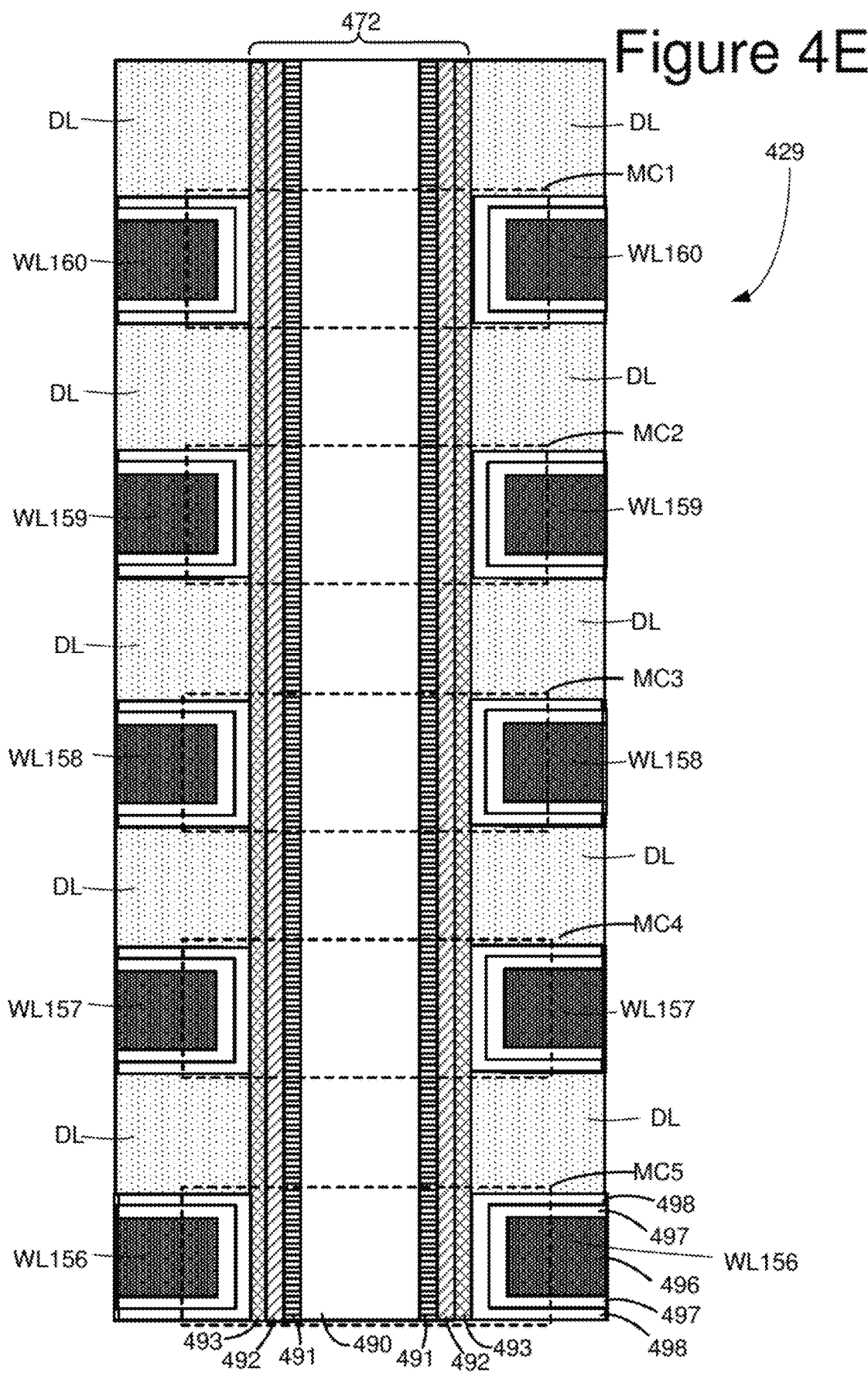
FIG. 4E is a cross sectional view of one embodiment of a vertical column of memory cells.

FIG. 4E depicts a cross sectional view of region 429 of FIG. 4C that includes a portion of memory hole/vertical column 472. In one embodiment, the memory holes/vertical columns are round; however, in other embodiments other shapes can be used. In one embodiment, memory hole/vertical column 472 includes an inner core layer 490 that is made of a dielectric, such as $SiO_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4E depicts dielectric layers DL as well as word line layers WL160, WL159, WL158, WL157, and WL156. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WL160 and a portion of memory hole/vertical column 472 comprise a memory cell MC1. Word line layer WL159 and a portion of memory hole/vertical column 472 comprise a memory cell MC2. Word line layer WL158 and a portion of memory hole/vertical column 472 comprise a memory cell MC3. Word line layer WL157 and a portion of memory hole/vertical column 472 comprise a memory cell MC4. Word line layer WL156 and a portion of memory hole/vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4F:
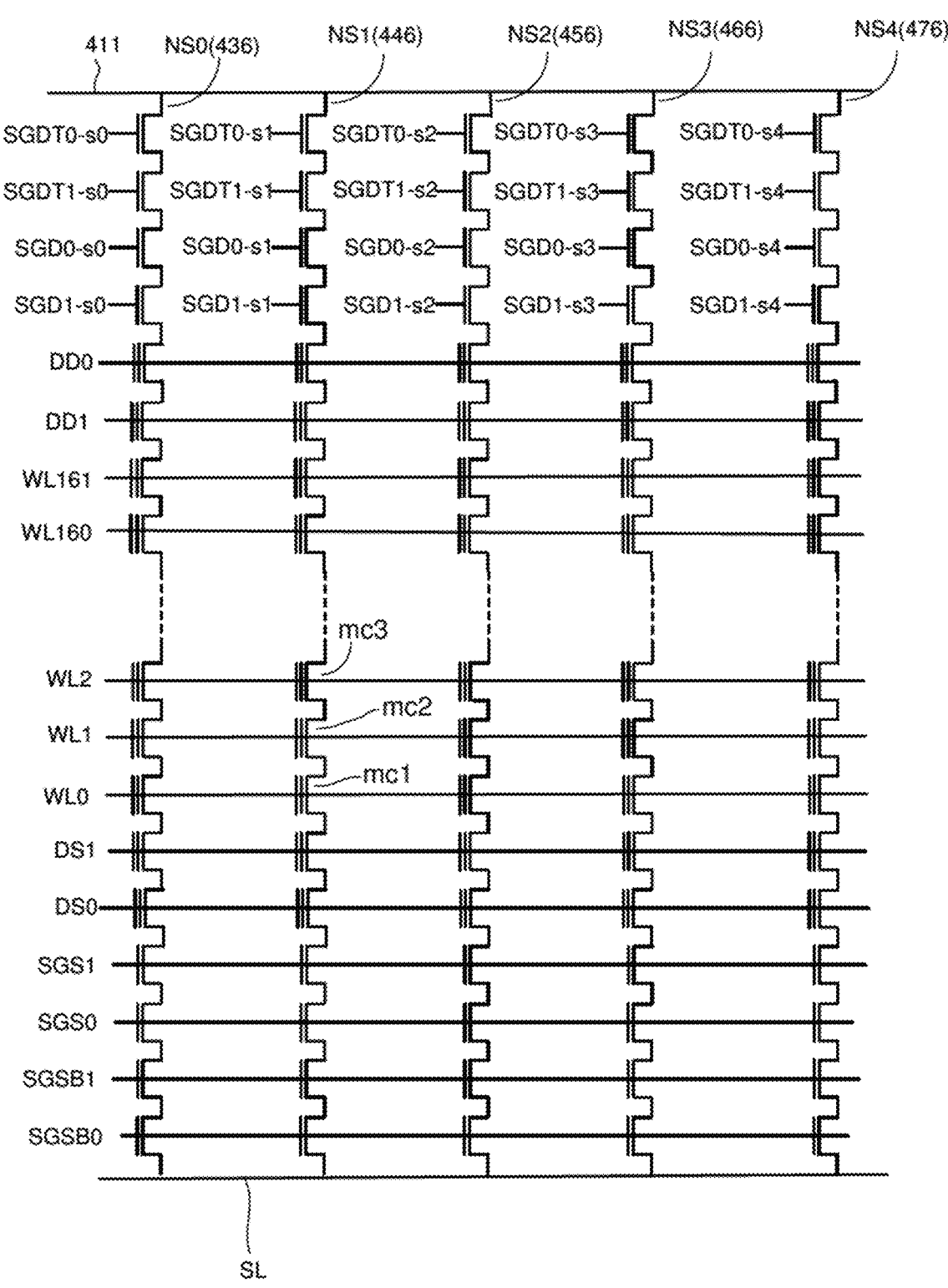
FIG. 4F is a schematic of a plurality of NAND strings in multiple regions of a same block.

FIG. 4F is a schematic diagram of a portion of the three dimensional memory array 202 depicted in in FIGS. 4-4E. FIG. 4F shows physical data word lines WL0-WL161 running across the entire block. The structure of FIG. 4F corresponds to a portion 406 in Block 2 of FIG. 4A, including bit line 411. Within the block, in one embodiment, each bit line is connected to five NAND strings, one in each region of regions 430, 440, 450, 460, 470. Thus, FIG. 4F shows bit line 411 connected to NAND string NS0 (which corresponds to memory hole/vertical column 436 of region 430), NAND string NS1 (which corresponds to memory hole/vertical column 446 of region 440), NAND string NS2 (which corresponds to vertical column 456 of region 450), NAND string NS3 (which corresponds to memory hole/vertical column 466 of region 460), and NAND string NS4 (which corresponds to memory hole/vertical column 476 of region 470).

Drain side select line/layer SGD0 is separated by isolation regions isolation regions 482, 484, 486 and 488 to form SGD0-*s0*, SGD0-*s1*, SGD0-*s2*, SGD0-*s3* and SGD0-*s4* in order to separately connect to and independently control regions 430, 440, 450, 460, 470. Similarly, drain side select line/layer SGD1 is separated by isolation regions 482, 484, 486 and 488 to form SGD1-*s0*, SGD1-*s1*, SGD1-*s2*, SGD1-*s3* and SGD1-*s4* in order to separately connect to and independently control regions 430, 440, 450, 460, 470; drain side GIDL generation transistor control line/layer SGDT0 is separated by isolation regions 482, 484, 486 and 488 to form SGDT0-*s0*, SGDT0-*s1*, SGDT0-*s2*, SGDT0-*s3* and SGDT0-*s4* in order to separately connect to and independently control regions 430, 440, 450, 460, 470; drain side GIDL generation transistor control line/layer SGDT1 is separated by isolation regions 482, 484, 486 and 488 to form SGDT1-*s0*, SGDT1-*s1*, SGDT1-*s2*, SGDT1-*s3* and SGDT1-*s4* in order to separately connect to and independently control regions 430, 440, 450, 460, 470.

FIG. 4F only shows NAND strings connected to bit line 411. However, a full schematic of the block would show every bit line and five vertical NAND strings (that are in separate regions) connected to each bit line.

Although the example memories of FIGS. 4-4F are three dimensional memory structure that includes vertical NAND strings with charge-trapping material, other (2D and 3D) memory structures can also be used with the technology described herein.

Figure 5A:
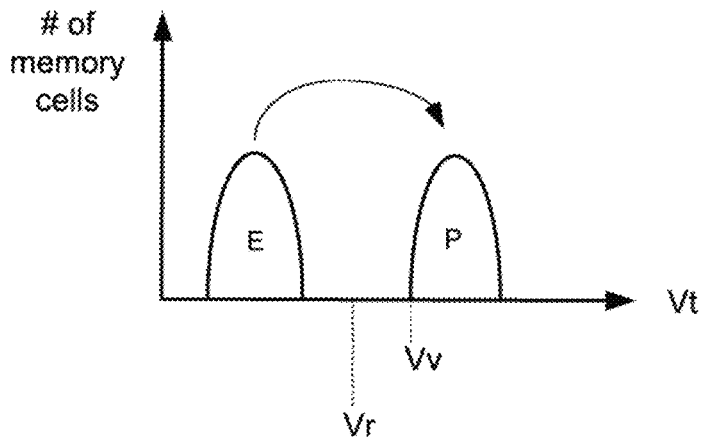
FIG. 5A depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

Figure 5B:
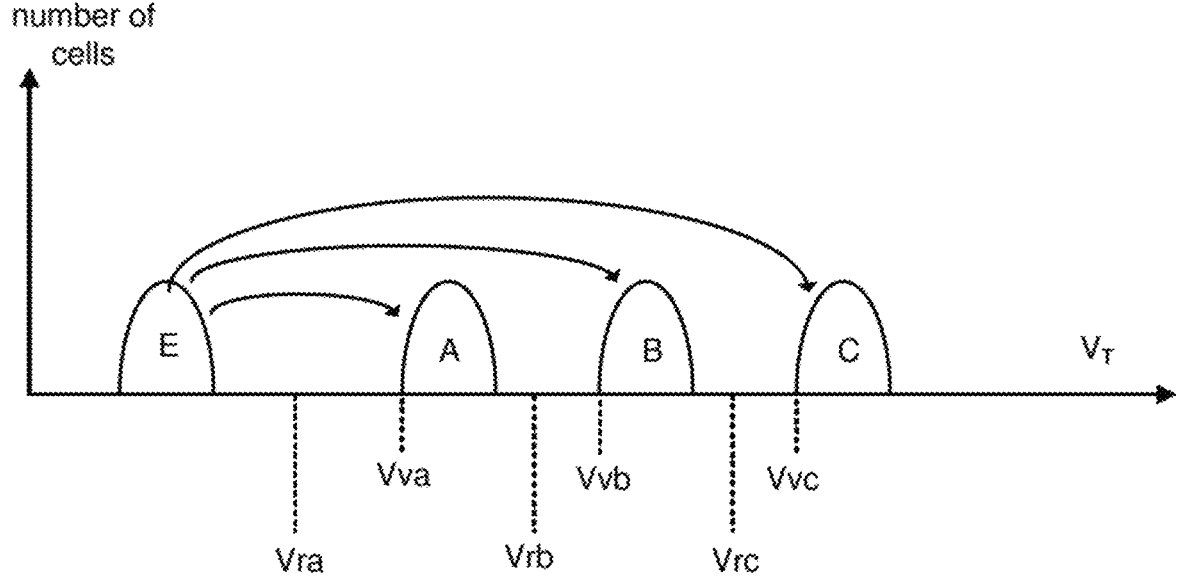
FIG. 5B depicts threshold voltage distributions.
Figures 5C, 5D:
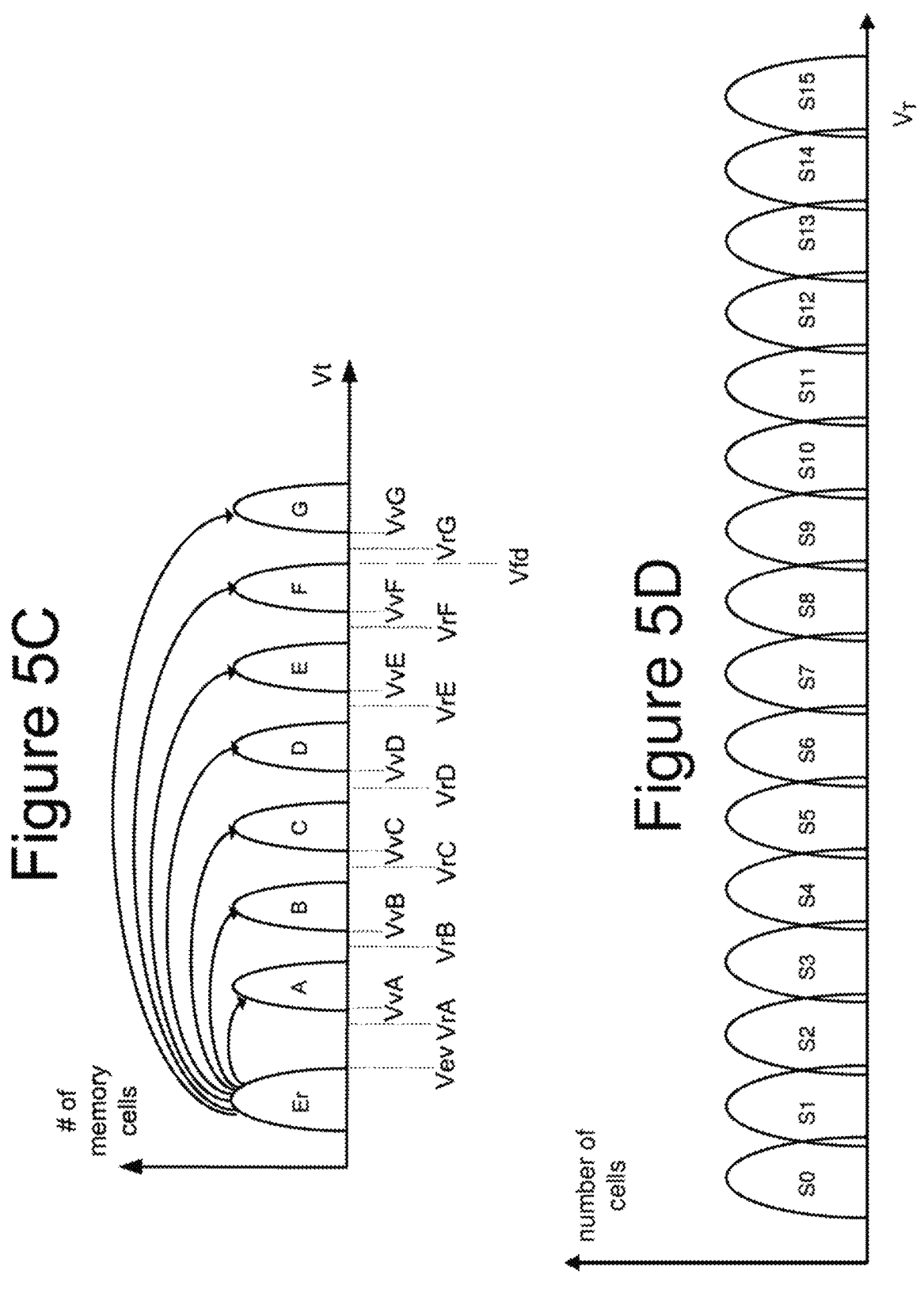
FIG. 5C depicts threshold voltage distributions.
FIG. 5D depicts threshold voltage distributions.

FIGS. 5B-D illustrate example threshold voltage distributions for the memory array when each memory cell stores multiple bit per memory cell data. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, or five bits of data per memory cell).

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

|     | E | A | B | C |
| --- | --- | --- | --- | --- |
| LP  | 1 | 0 | 0 | 1 |
| UP  | 1 | 1 | 0 | 0 |

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

|  | Er | A | B | C | D | E | F | G |
|---|---|---|---|---|---|---|---|---|
| UP | 1 | 1 | 1 | 0 | 0 | 0 | 0 | 1 |
| MP | 1 | 1 | 0 | 0 | 1 | 1 | 0 | 0 |
| LP | 1 | 0 | 0 | 0 | 0 | 1 | 1 | 1 |

FIG. 5C shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in and, therefore what data is being stored by a memory cell.

FIG. 5C also shows seven verify reference voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is an erase verify reference voltage to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state Er to data state A, other memory cells are being programmed from data state Er to data state B and/or from data state Er to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare voltages/levels VrA, VrB, VrC, VrD, VrE, VrF, and VrG, of FIG. 5C) or verify operation (e.g. see verify target voltages/levels VvA, VvB, VvC, VvD, VvE. VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read reference voltages can help to mitigate such effects. Using ECC during the read process can fix errors and ambiguities. Note that in some embodiments, the threshold voltage distributions for a population of memory cells storing four bits of data per memory cell do not overlap and are separated from each other. The threshold voltage distributions of FIG. 5D will include read reference voltages and verify reference voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits. The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

|    | S0 | S1 | S2 | S3 | S4 | S5 | S6 | S7 | S8 | S9 | S10 | S11 | S12 | S13 | S14 | S15 |
|----|----|----|----|----|----|----|----|----|----|----|-----|-----|-----|-----|-----|-----|
| TP | 1  | 1  | 1  | 1  | 1  | 0  | 0  | 0  | 0  | 0  | 1   | 1   | 0   | 0   | 0   | 1   |
| UP | 1  | 1  | 0  | 0  | 0  | 0  | 0  | 0  | 1  | 1  | 1   | 1   | 1   | 1   | 0   | 0   |
| MP | 1  | 1  | 1  | 0  | 0  | 0  | 0  | 1  | 1  | 0  | 0   | 0   | 0   | 1   | 1   | 1   |
| LP | 1  | 0  | 0  | 0  | 1  | 1  | 0  | 0  | 0  | 0  | 0   | 1   | 1   | 1   | 1   | 1   |

Figure 6:
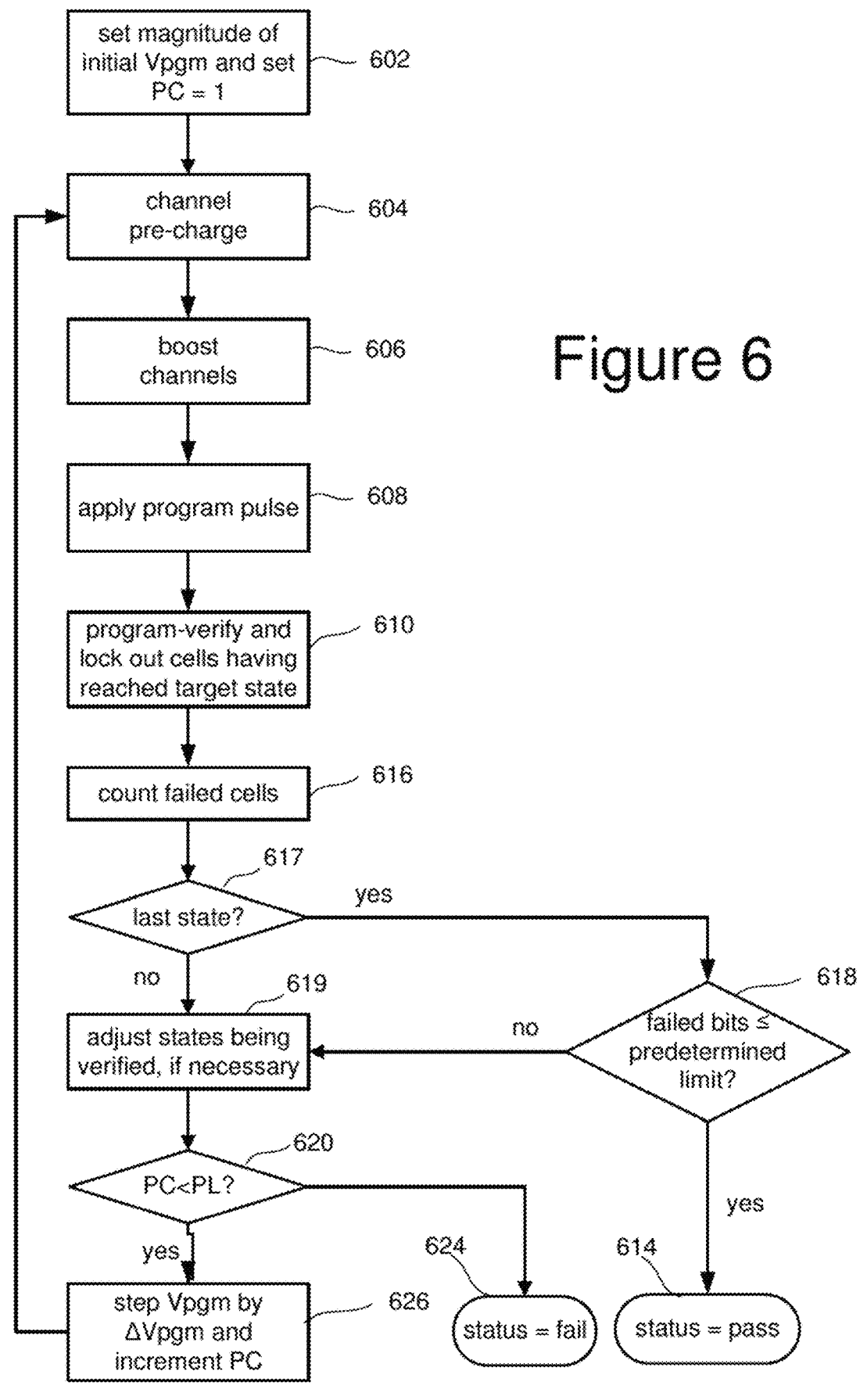
FIG. 6 is a flow chart describing one embodiment of a process for programming non-volatile memory.

FIG. 6 is a flowchart describing one embodiment of a process for programming memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory die 201. The process includes multiple loops, each of which includes a program phase and a verify phase. The process of FIG. 6 is performed to implement the full sequence programming, as well as other programming schemes including multi-stage programming. When implementing multi-stage programming, the process of FIG. 6 is used to implement any/each stage of the multi-stage programming process.

Typically, the program voltage applied to the control gates (via a selected data word line) during a program operation is applied as a series of program voltage pulses. Between program voltage pulses are a set of verify pulses (e.g., voltage pulses) to perform verification. In many implementations, the magnitude of the program voltage pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program-verify is performed, which includes testing whether memory cells being programmed have successfully reached their target data state. Memory cells that have reached their target states are locked out from further programming by the control die. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state.

In one embodiment of step 610, a smart verify technique is used such that the system only verifies a subset of data states during a program loop (steps 604-628). For example, the first program loop includes verifying for data state A (see FIG. 5C), depending on the result of the verify operation the second program loop may perform verify for data states A and B, depending on the result of the verify operation the third program loop may perform verify for data states B and C, and so on.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 617, the system determines whether the verify operation in the latest performance of step 610 included verifying for the last data state (e.g., data state G of FIG. 5C). If so, then in step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, then the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If in step 617 it was determined that the verify operation in the latest performance of step 610 did not include verifying for the last data state or in step 618 it was determined that the number of failed memory cells is not less than the predetermined limit, then in step 619 the data states that will be verified in the next performance of step 610 (in the next program loop) is adjusted as per the smart verify scheme discussed above. In step 620, the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size $\Delta$Vpgm (e.g., a step size of 0.1-1.0 volts). After step 626, the process continues at step 604 and another program pulse is applied to the selected word line (by the control die) so that another program loop (steps 604-626) of the programming process of FIG. 6 is performed.

In one embodiment memory cells are erased prior to programming. Erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D. In one embodiment, the control circuit is configured to program memory cells in the direction from the erased data state toward the highest data state (e.g., from data state Er to data state G) and erase memory cells in the direction from the highest data state toward the erased data state (e.g., from data state G to data state Er).

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the memory cells. Herein, this is referred to as p-well erase.

Another approach to erasing memory cells is to generate gate induced drain leakage ("GIDL") current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a GIDL generation transistor (e.g., transistors connected to SGDT0, SGDT1, SGSB0, and SGSB1). In some embodiments, a select gate (e.g., SGD or SGS) can be used as a GIDL generation transistor. A transistor drain-to-gate voltage that generates a GIDL current is referred to herein as a GIDL voltage. The GIDL current may result when the GIDL generation transistor drain voltage is significantly higher than the GIDL generation transistor control gate voltage. GIDL current is a result of carrier generation, i.e., electron-hole pair generation due to band-to-band tunneling and/or trap-assisted generation. In one embodiment, GIDL current may result in one type of carriers (also referred to a charge carriers), e.g., holes, predominantly moving into the NAND channel, thereby raising or changing the potential of the channel. The other type of carriers, e.g., electrons, are extracted from the channel, in the direction of a bit line or in the direction of a source line by an electric field. During erase, the holes may tunnel from the channel to a charge storage region of the memory cells (e.g., to charge trapping layer 493) and recombine with electrons there, to lower the threshold voltage of the memory cells.

The GIDL current may be generated at either end (or both ends) of the NAND string. A first GIDL voltage may be created between two terminals of a GIDL generation transistor (e.g., connected to SGDT0, SGDT1) that is connected to or near a bit line to generate a first GIDL current. A second GIDL voltage may be created between two terminals of a GIDL generation transistor (e.g., SGSB0, SGSB1) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase. The technology described herein can be used with one-sided GIDL erase and two-sided GIDL erase.

FIG. 6A is a flow chart describing one embodiment of a process for reading non-volatile memory. In step 670, memory controller 120 receives request to read data (e.g., from host 102). In step 672, memory controller 120 sends one or more read commands to memory die 200 (or integrated memory assembly 207). In step 674, memory diem 200 (or integrated memory assembly 207) performs sensing. In step 676, the memory die 200 (or integrated memory assembly 207) transmits sensed data to memory controller 120. In step 678, memory controller 120 decodes the data received from the memory die (or integrated memory assembly). In step 680, memory controller 120 returns the decoded data to the entity (e.g., host 102) requesting the read process.

Memory systems often use Error Correction Codes (ECC) to protect data form corruption. Many ECC coding schemes are well known in the art. These conventional error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as ½). Examples of well-known ECC codes commonly used in connection with flash memory storage include Reed-Solomon codes, other BCH codes, Hamming codes, and the like. Sometimes, the error correction codes used in connection with flash memory storage are "systematic." in that the data portion of the eventual code word is unchanged from the actual data being encoded, with the code or parity bits appended to the data bits to form the complete code word.

The particular read parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, the memory controller 120 receives host data, also referred to as information bits, that is to be programmed into non-volatile memory array 202. The informational bits are represented by the matrix i=[1 0] (note that two bits are used for example purposes only, and many embodiments have code words longer than two bits). An error correction coding process (such as any of the processes mentioned above or below) is implemented in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, January 1962; and D. MacKay, Information Theory, Inference and Learning Algorithms, Cambridge University Press 2003, chapter 47. In practice, such LDPC codes are typically applied to multiple pages encoded across a number of storage elements, but they do not need to be applied across multiple pages. The data bits can be mapped to a logical page and stored in the non-volatile memory by programming one or more memory cells to one or more data states, which corresponds to v.

Therefore, the programming process comprises encoding the data as code words that includes the original data and additional information used for error correction, and then programming the code words into the non-volatile memory cells. The reading process incudes sensing the code words (e.g., step 674) and decoding the code words to obtain the original data stored (e.g., step 678).

In one possible implementation, an iterative probabilistic decoding process is used in step 678 which implements error correction decoding corresponding to the encoding implemented in the memory controller 120. Further details regarding iterative probabilistic decoding can be found in the above-mentioned D. Mackay text. The iterative probabilistic decoding attempts to decode a code word read from the memory by assigning initial probability metrics to each bit in the code word. The probability metrics indicate a reliability of each bit, that is, how likely it is that the bit is not in error. In one approach, the probability metrics are logarithmic likelihood ratios LLRs which are obtained from LLR tables. LLR values are measures of the reliability with which the values of various binary bits read from the storage elements are known.

The LLR for a bit is given by $$Q = \log_2 \frac{P(v = 0 \mid Y)}{P(v = 1 \mid Y)},$$

where P (v=0|Y) is the probability that a bit is a 0 given the condition that the state read is Y, and P (v=1|Y) is the probability that a bit is a 1 given the condition that the state read is Y. Thus, an LLR>0 indicates a bit is more likely a 0 than a 1, while an LLR<0 indicates a bit is more likely a 1 than a 0, to meet one or more parity checks of the error correction code. Further, a greater magnitude indicates a greater probability or reliability. Thus, a bit with an LLR=63 is more likely to be a 0 than a bit with an LLR=5, and a bit with an LLR=−63 is more likely to be a 1 than a bit with an LLR=−5. LLR=0 indicates the bit is equally likely to be a 0 or a 1.

An LLR value can be provided for each of the bit positions in a code word. Further, the LLR tables can account for the multiple read results so that an LLR of greater magnitude is used when the bit value is consistent in the different code words.

Memory controller 120 receives the code word Y1 and the LLRs and iterates in successive iterations in which it determines if parity checks of the error encoding process have been satisfied. If all parity checks have been satisfied, the decoding process has converged and the code word has been successfully error corrected. If one or more parity checks have not been satisfied, the decoder will adjust the LLRs of one or more of the bits which are inconsistent with a parity check and then reapply the parity check or next check in the process to determine if it has been satisfied. For example, the magnitude and/or polarity of the LLRs can be adjusted. If the parity check in question is still not satisfied, the LLR can be adjusted again in another iteration. Adjusting the LLRs can result in flipping a bit (e.g., from 0 to 1 or from 1 to 0) in some, but not all, cases. In one embodiment, another parity check is applied to the code word, if applicable, once the parity check in question has been satisfied. In others, the process moves to the next parity check, looping back to the failed check at a later time. The process continues in an attempt to satisfy all parity checks. Thus, the decoding process of Y1 is completed to obtain the decoded information including parity bits v and the decoded information bits i.

Figure 7:
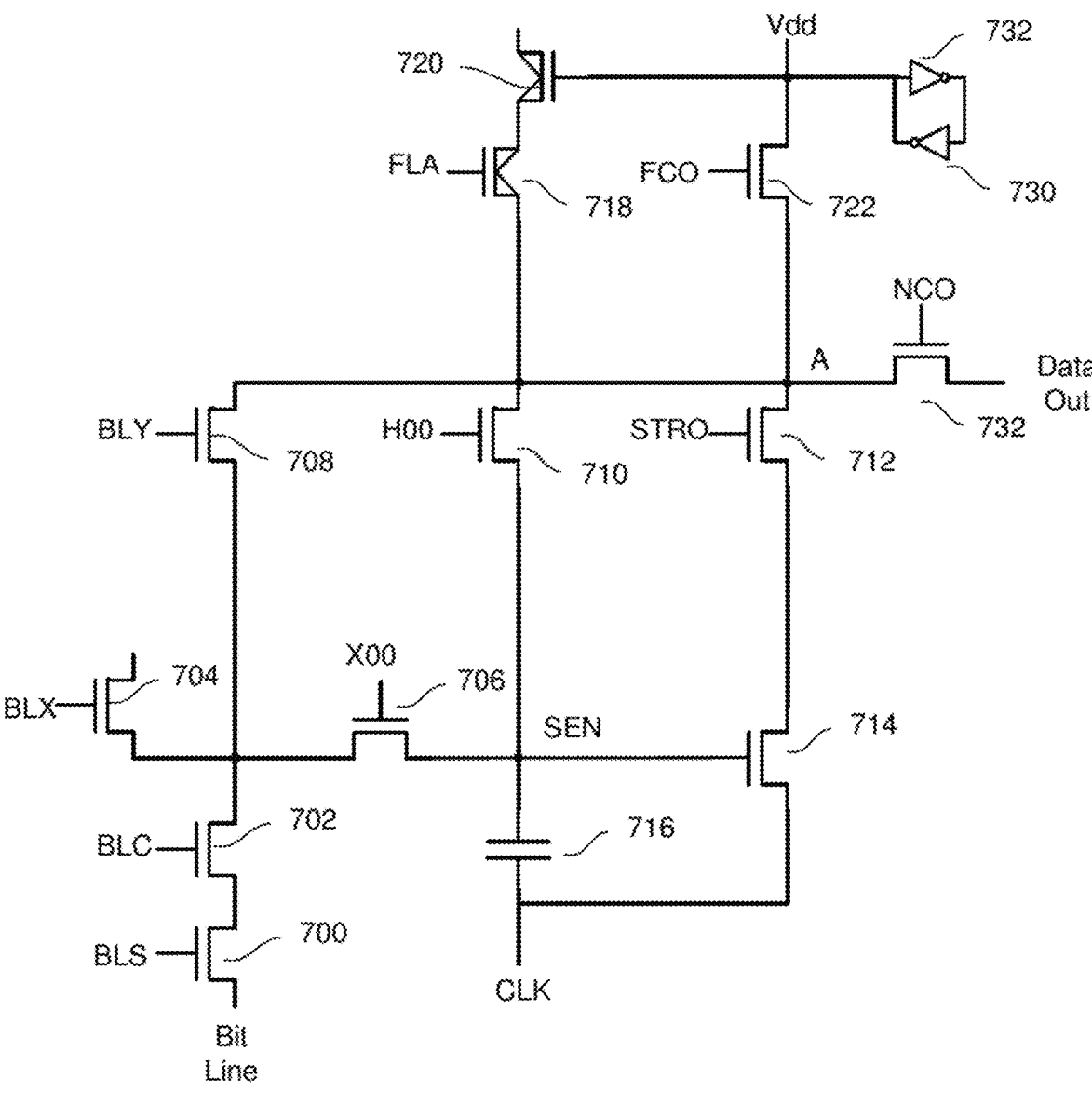
FIG. 7 is a schematic drawing of a sense amplifier.

The sensing on the memory die (e.g., step 674), which includes determining whether a memory cell has a threshold voltage that exceeds a read compare voltage (e.g., VrA, VrB, VrC, VrD, VrE, VrF, and VrG of FIG. 5C), is performed by sense amplifiers 230. FIG. 7 is a schematic diagram depicting one example circuit of a sense amplifier that can perform the sensing during a read or verify processes. Other sense amplifier circuits can also be used. As described above and below, the circuit of FIG. 7 will pre-charge a capacitor (or other charge storage device) to a pre-charge magnitude, discharge the capacitor through the memory cell for a sense time, and sense voltage at the capacitor after the sense time. The sensed voltage will be indicative of whether the memory cells conducted the current being sensed for, which is indicative of whether the threshold voltage of the memory cell is greater than or less than the read compare voltage or verify compare voltage being tested for (corresponding to the control gate voltage).

FIG. 7 shows transistor 700 connected to the Bit Line and transistor 702. Transistor 700 receives the signal BLS at its gate, and is used to connect to or isolate the Bit Line (sometimes called an isolation transistor). Transistor 702 receives the signal BLC at its gate, and is used as a voltage clamp (e.g., voltage clamp transistor). The gate voltage BLC is biased at a constant voltage equal to the desired Bit Line voltage plus the threshold voltage of transistor 702. The function of transistor 702, therefore, is to maintain a constant Bit Line voltage during a sensing operation (e.g., during read or verify), even if the current through the Bit Line changes.

Transistor 702 is connected to transistors 704, 706 and 708. Transistor 706 is connected to capacitor 716 at the node marked SEN. The purpose of transistor 706 is to connect capacitor 716 to the Bit Line and disconnect capacitor 716 from the Bit Line so that capacitor 716 is in selective communication with the Bit Line. In other words, transistor 706 regulates the sense time mentioned above. That is, while transistor 706 is turned on capacitor 716 can discharge through the Bit Line, and when transistor 706 is turned off capacitor 716 cannot discharge through the Bit Line. The gate voltage of transistor 706 is labeled as X00. As described herein, in some embodiments of the disclosed technology, the sense time is subject to adjustment as described below. Changing the sense time can include changing the timing of the signal X00.

The node at which transistor 706 connects to capacitor 716 is also connected to transistor 710 and transistor 714. Transistor 710 is connected to transistors 708, 712 and 718. Transistor 718 is also connected to transistor 720. Transistors 718 and 720 are PMOS transistors while the other transistors of FIG. 7 are NMOS transistors. Transistors 710, 718, and 720 provide a pre-charging path to capacitor 716. A voltage (e.g., Vdd or other voltage) is applied to the source of transistor 720. By appropriately biasing transistors 710, 718 and 720, the voltage applied to the source of transistor 720 can be used to pre-charge capacitor 716. After pre-charging, capacitor 716 can discharge through the Bit Line via transistor 706 (assuming that transistors 700 and 702 are conducting).

The circuit of FIG. 7 includes inverters 730 and 732 forming a latch circuit. The output of inverter 732 is connected to the input of inverter 730 and the output of inverter 730 is connected to the input of inverter 732 as well as transistors 720 and 722. The input of inverter 732 will receive Vdd and the two inverters 730, 732 will act as a latch to store Vdd. The input of inverter 732 can also be connected to another value. Transistors 712 and 722 provide a path for communicating the data stored by inverters 730 and 732 to transistor 714. Transistor 722 receives the signal FCO at its gate. Transistor 712 receives the signal STRO at its gate. By raising or lowering FCO and STRO, a path is provided or cut off between the inverters 730, 732 and transistor (sensing switch) 714. The gate of transistor 714 is connected capacitor 716, transistor 706 and transistor 710 at the node marked SEN. The other end of capacitor 716 is connected to the signal CLK.

As discussed above, capacitor 716 is pre-charged via transistors 710, 718 and 720. This will raise the voltage at the SEN node to a pre-charge voltage level (Vpre). When transistor 706 turns on, capacitor 716 can discharge its charge through the Bit Line and the selected memory cell if the threshold voltage of the memory cell is below the voltage level being tested for. If the capacitor 716 is able to discharge, then the voltage at the capacitor (at the SEN node) will decrease.

The pre-charge voltage (Vpre) at the SEN node is greater than the threshold voltage of transistor 714; therefore, prior to the sense time, transistor 714 is on (conducting). Since transistor 714 is on during the sense time, then transistor 712 should be off. If the capacitor does not sufficiently discharge during the sense time, then the voltage at the SEN node will remain above the threshold voltage of transistor 714 and the charge at the inverters 730, 732 can be discharged into the CLK signal when STRO turns on transistor 712. If the capacitor discharges sufficiently during the sense time, then the voltage at the SEN node will decrease below the threshold voltage of transistor 714; thereby, turning off transistor 714 and the data (e.g., Vdd) stored at inverters 730, 732 is prevented from being discharged through CLK. So testing whether the diodes 730, 732 maintain their charge or discharge will indicate the result of the sensing process. In one embodiment, the result can be read at node A via transistor 732 (Data Out) by turning on transistor 734 gate signal NCO. In some embodiments, the result can be read at node A multiple times during the sense time in order to test for multiple read compare voltages, multiple verify compare voltages or multiple soft bits.

The pre-charge level of capacitor 716 (and, thus, the pre-charge voltage at node SEN) is limited by the current passing through transistor 710. The current that passes through transistor 710 is limited by the gate voltage H00. As such, the pre-charge voltage at node SEN is limited by the voltage H00 less the threshold voltage of transistor 710. With this arrangement, the system can regulate the pre-charge voltage at node SEN by regulating H00. A larger voltage at H00 results in a larger voltage at the SEN node when pre-charging. A lower voltage at H00 results in a lower voltage at the SEN node when pre-charging.

When the system performs a read/verify operation, the voltage applied to the control gate of the memory cell may cause the channel (connected to the bit line) of the cell to conduct. If this happens, a capacitor is discharged through the channel, lowering in voltage as it discharges.

Figures 8, 9:
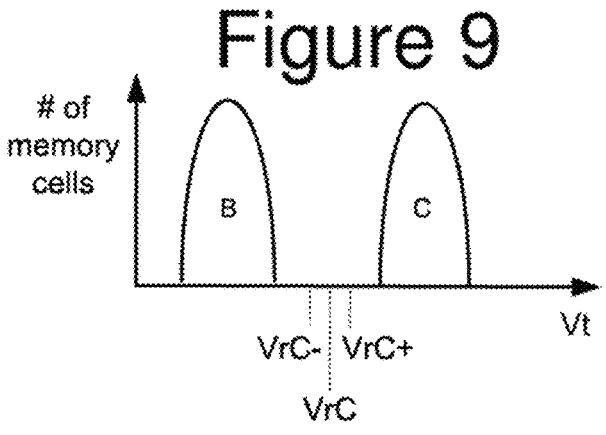
FIG. 8 is a timing diagram explaining behavior of the sense amplifier of FIG. 7.
FIG. 9 is a graph that depicts two threshold voltage distributions.

FIG. 8 is a timing diagram describing the behavior of various signals from FIG. 7 during a sensing operation (e.g., for reading or verifying). The signal BLS is at Vdd the entire time depicted. The signal BLC is at Vbl+Vsrc+Vth, where Vbl is the voltage of the Bit, Vsrc is the voltage of the source line and Vth is the threshold voltage of transistor 702. The signal FLA starts at Vss at t0 and goes to Vdd at t6. When the signal FLA is at Vss, the pre-charging path is regulated by transistor 710. At t0, the voltage of H00 is raised from ground to a pre-charge level. The raising of the voltage at H00 turns on transistor 710 and opens up the pre-charge path. The magnitude of the voltage at H00 is set. FIG. 8 shows H00 going to Vhoo. Note that in some embodiments, the circuit of FIG. 7 can respond to more than one voltage magnitude for H00. For example, in one embodiment, the output of the circuit of FIG. 7 is a linear function with respect to position of the memory cell being sensed so that there are many different possible voltage magnitudes for H00, depending on position of the memory cell being sensed. The signal H00 will stay at the pre-charge voltage (Vhoo) until time t1. While H00 is high, transistor 710 turns on and capacitor 716 will pre-charge between t0 and t1, as depicted by the voltage at SEN (depicted second from the bottom on FIG. 8). At time t1, H00 is brought down to Vss and the pre-charging is completed.

The signal X00 is used to allow capacitor 716 to be in communication with the Bit Line so that the capacitor can discharge through the Bit Line and the selected memory cell. At time t3, X00 is raised to Vblc+Vblx, where Vblx is the voltage of the signal BLX (discussed above). At time t4, the voltage at X00 is lowered to Vss. Between times t3 and t4, known as the sense time, capacitor 716 will be in communication with the Bit Line in order to allow it to discharge through the Bit Line and the selected memory cell (depending on the threshold voltage of the selected memory cell). The signal CLK is raised to Vblx at time t2 and lowered back down to Vss at time t5 to prevent any fighting conditions in the circuit and to allow proper discharge of capacitor 716.

As discussed above, because H00 is raised between t0 and t1, capacitor 716 (and SEN node) will charge up between t0 and t1 (the pre-charge). This is depicted in FIG. 8 with the SEN node charging from Vss to Vpre. The solid line for Vpre represents an example pre-charging of the node SEN (and capacitor 716) in response to Vh00 being applied to the gate of transistor 710.

When X00 is raised up at t3, capacitor 716 can initially pre-charge the bit line and then discharge through the Bit Line (if the threshold voltage is at the appropriate level). As depicted in FIG. 8 between t3 and t4, the voltage at the SEN node can dissipate from Vpre to Vpost_con if the memory cell turns on (conducts) because its threshold voltage is less than or equal to the voltage being applied to its control gate. If the threshold voltage for the memory cell being tested is higher than the voltage applied to its control gate, capacitor 716 will not discharge and the voltage will remain at Vpre. The period between t3 and t4 is the sense time time and can be adjusted.

FIG. 8 shows that the signal FCO is raised to Vdd at t7 and lowered to Vss at t9. The signal STRO is raised to Vdd at 18 and lowered at t9. Between times t8 and t9, there is a path between the inverters 730, 732 and transistor 714. If the voltage at the node SEN is greater than the threshold voltage of transistor 714, then there will be a path from the inverters 730, 732 to CLK and the data at the inverters 730,732 will dissipate through the signal CLK and through the transistor 714. If the voltage at the node SEN is lower than threshold voltage of transistor 714 (e.g. if the capacitor discharged), then transistor 714 will turn off and the voltage stored by the inverters 730, 732 will not dissipate into CLK. FIG. 8 shows the voltage level at node A at Vdd. If the voltage of the capacitor does not dissipate (e.g., due to not enough current flowing because the threshold voltage of the selected memory cell is greater than the voltage being tested for), then transistor 714 will remain on and the voltage at node A will dissipate to Vss (as depicted by the dashed line). If the voltage of the capacitor does dissipate (e.g., due to sufficient current flowing because the threshold voltage of the selected memory cell is below the voltage being tested for), then transistor 714 will turn off and the voltage at node A will remain at Vdd (as depicted by the solid line). The output of node A is provided to the Data Out signal via transistor 734 by applying Vdd to the signal NCO.

In some embodiments, a memory system will only sense at the read compare voltages (e.g., VrA, VrB, VrC, VrD, VrE, VrF, and VrG of FIG. 5C). The data from the sensing at the read compare voltages are referred to as hard bits. In some embodiments, in addition to sensing at the read compare voltages, the memory system will perform additional sensing above and/or below the read compare voltages. The data from the additional sensing above and below the read compare voltages are referred to as soft bits. FIG. 9 depicts an example of a hard bit and two soft bits. More specifically, FIG. 9 shows two example threshold voltage distributions corresponding to programmed data states B and C of FIG. 5C. FIG. 9 also shows read compare voltage Vrc (corresponding to a hard bit) and compare voltages VrC− & VrC+ (which correspond to soft bits). Memory controller 120 will use the hard bits and soft bits to decode the code words and obtain the original data. The use of soft bits improves the accuracy of the decoding process. Although FIG. 9 shows two soft bits, in other embodiments more than two soft bits can be used. In another embodiment, the system only senses soft bits, without sensing hard bits and memory controller 120 performs the decoding by only using soft bits. In another embodiment, the system senses the hard bit (e.g., at VrC) and one soft bit (e.g., at VrC+), and memory controller 120 performs the decoding by using the one hard bit and one soft bit.

Figure 10:
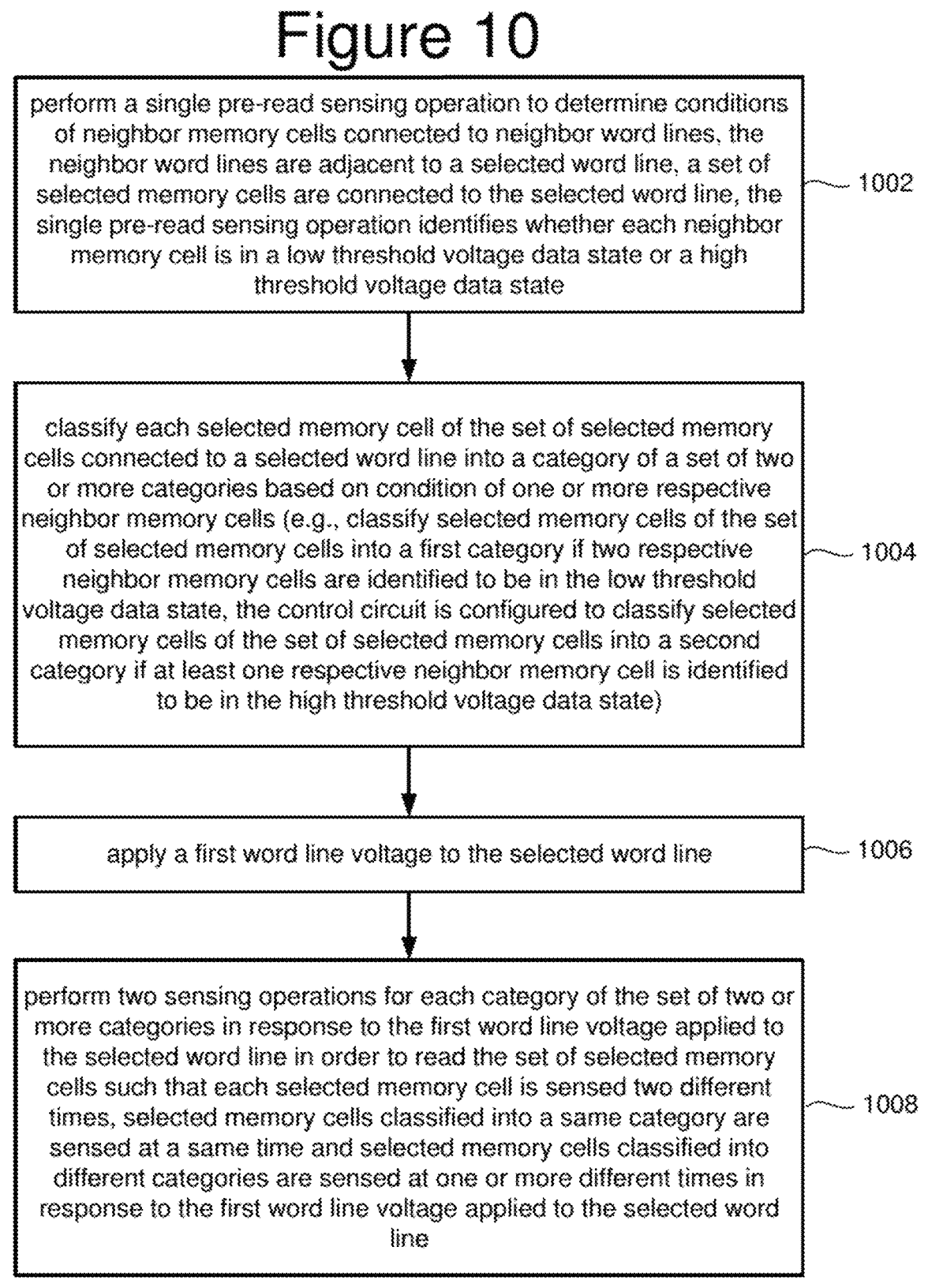

FIG. 10 is a flow chart describing one embodiment of a process for reading non-volatile memory. In one example embodiment, the process of FIG. 10 is performed during step 674 of FIG. 6A. In one example implementation, the process of FIG. 10 can be performed by any one of the one or more control circuits discussed above. The process of FIG. 10 can be performed entirely by a control circuit on memory die 200 (see FIG. 2A) or entirely by a control circuit on integrated memory assembly 207 (see FIG. 2B), rather than by memory controller 120. In one example, the process of FIG. 10 is performed by or at the direction of state machine 262, using other components of System Control Logic 260, Column Control Circuitry 210 and Row Control Circuitry 220. In another embodiment, the process of FIG. 10 is performed by or at the direction of memory controller 120 in combination with System Control Logic 260, Column Control Circuitry 210 and Row Control Circuitry 220.

In step 1002 of FIG. 10, the control circuit performs a single pre-read sensing operation to determine conditions of neighbor memory cells connected to neighbor word lines. The neighbor word lines are adjacent to a selected word line. A set of selected memory cells are connected to the selected word line. The selected word line is the word line selected for reading. For example, if the system is reading memory cells connected to word line WL1, then WL1 is the selected word line and word lines WL0 and WL2 are the neighbor word lines. Memory cells on the selected word line that are to be read are referred to as selected memory cells. Memory cells on neighbor word lines that are adjacent to selected memory cells are neighbor memory cells; for example, memory cells mc1 and mc3 are neighbor memory cells to memory cell mc2 (see FIG. 4F). In one embodiment, the single pre-read sensing operation of step 1002 identifies whether each neighbor memory cell is in a low threshold voltage data state or a high threshold voltage data state. In one example implementation that includes storing three bits of data per memory cell (see e.g., FIG. 5C), low threshold voltage data states includes data states Er, A, B, C and D; and high threshold voltage data states include data states E, F and G. Other groupings of low threshold voltage data states and high threshold voltage data states can also be used.

Figure 11:
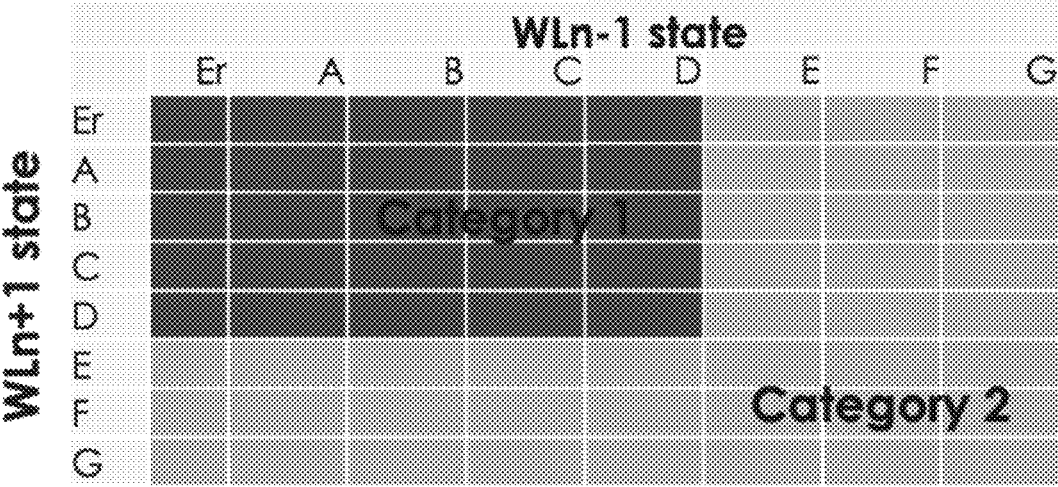
FIG. 11 is a table defining two categories based on conditions of neighbor non-volatile memory cells.

In step 1004, the control circuit classifies each selected memory cell of the set of selected memory cells connected to a selected word line into a category of a set of two or more categories based on condition of one or more respective neighbor memory cells. For example, the control circuit will classify selected memory cells of the set of selected memory cells into a first category if two respective neighbor memory cells are identified to be in the low threshold voltage data state and the control circuit is configured to classify selected non-volatile memory cells of the set of selected non-volatile memory cells into a second category if at least one respective neighbor memory cell is identified to be in the high threshold voltage data state. This concept is explained by FIG. 11, which shows a table indexed by data state and explains one example embodiment of how to classify selected memory cells of the set of selected memory cells into a first category if two respective neighbor memory cells are identified to be in the low threshold voltage data state and classify selected non-volatile memory cells of the set of selected non-volatile memory cells into a second category if at least one respective neighbor memory cell is identified to be in the high threshold voltage data state. The selected word line is referred to as WLn; therefore, the neighbor word lines are WLn−1 and WLn+1. The horizontal axis of the table depicted in FIG. 11 is indexed by the data state the neighbor memory cell connected to WLn−1 is currently in. The vertical axis of the table depicted in FIG. 11 is indexed by the data state the neighbor memory cell connected to WLn+1 is currently in. Based on the intersection of the data states of the two neighbors, the system classifies the selected memory cell to be in Category 1 or Category 2. For example, if the neighbor memory cell connected to WLn−1 is in data state C (low threshold voltage data state) and the neighbor memory cell connected to WLn+1 is in data state B (low threshold voltage data state), then the selected memory cell is classified into Category 1. If the neighbor memory cell connected to WLn−1 is in data state C (low threshold voltage data state) and the neighbor memory cell connected to WLn+1 is in data state F (high threshold voltage data state), then the selected memory cell is classified into Category 2.

Figure 12:
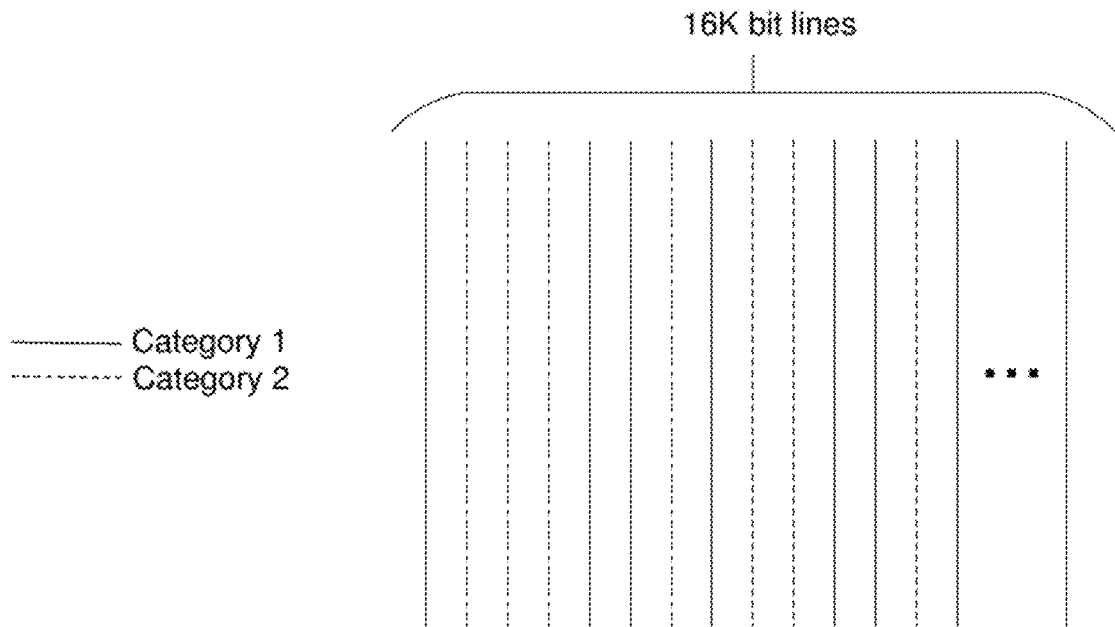
FIG. 12 depicts a plurality of bit lines.

As a result of the classification of step 1004, some selected memory cells connected to the selected word line will be classified to Category 1 and some selected memory cells connected to the selected word line will be classified to Category 2. In one embodiment, selected memory cells are connected to separate and different bit lines; therefore, the bit lines will be connected to either a memory cell classified to Category 1 or a memory cell classified to Category 2. FIG. 12 depicts one example of how the bit lines are connected to either a memory cell classified to Category 1 or a memory cell classified to Category 2.

Looking back at the method of FIG. 10, in step 1006 the control circuit applies a first word line voltage to the selected word line. In one example, the first word line voltage is one of the read compare voltages (e.g., VrA, VrB, VrC, VrD, VrE, VrF, and VrG of FIG. 5C). Since the selected memory cells are all connected to the selected word line, all of the selected memory cells concurrently receive the first word line voltage.

In step 1008, the control circuit performs two sensing operations for each category of the set of two or more categories in response to (while applying) the first word line voltage applied to the selected word line in order to read the set of selected non-volatile memory cells such that each selected non-volatile memory cell is sensed two different times, selected non-volatile memory cells classified into a same category are sensed at a same time and selected non-volatile memory cells classified into different categories are sensed at one or more different times in response to the first word line voltage applied to the selected word line.

After the sensing of step 1008, the control circuit determines the data being stored in the set of selected memory cells based on the two sensing operations for each category. For example, the memory controller decodes the code words sensed in step 1008 (see step 678). In another example, the memory die 200 or integrated memory assembly 207 (e.g., state machine) decodes the code words sensed in step 1008.

In one embodiment, the process of FIG. 10 is performed for sensing at one read compare voltage for one data state, and the process can be repeated for additional data states (as discussed below) such that the performing two or more sensing operations for each category is also performed for the additional programmed data states. Thus, the control circuit is configured to perform the two sensing operations for each category of the set of two or more categories for each of multiple programmed data states.

In one embodiment, the two sensing operations for each category (step 1008) identifies two bits of data per memory cell per programmed data state, and at least one bit of each two bits of data per memory cell per programmed data state is a soft bit. The memory controller is configured to determine data being stored in the set of selected memory cells based on the two bits of data per memory cell per programmed data state, including the soft bits.

In some embodiments, the set of selected memory cells each store multiple bits of data in multiple pages and the control circuit is configured to perform the two sensing operations for each category of the set of two or more categories for each of multiple programmed data states to determine data being stored in one page (see e.g., the pages of Tables 1, 2 or 3, above) of the set of selected memory cells.

FIG. 13 is a flow chart describing one embodiment of a process for performing two sensing operations for each category in an example implementation that uses the two categories of FIG. 11. Thus, the process of FIG. 13 is performed during step 1008 of FIG. 10. In one example implementation, the process of FIG. 13 can be performed by any one of the one or more control circuits discussed above. The process of FIG. 13 can be performed entirely by a control circuit on memory die 200 (see FIG. 2A) or entirely by a control circuit on integrated memory assembly 207 (see FIG. 2B), rather than by memory controller 120. In one example, the process of FIG. 13 is performed by or at the direction of state machine 262, using other components of System Control Logic 260, Column Control Circuitry 210 and Row Control Circuitry 220.

In step 1302, the control circuit performs a first sensing operation at a first time for the first category (e.g., Category 1 of FIG. 11). In step 1304, the control circuit performs a second sensing operation at a second time, that is after the first time, for the first category. In step 1306, the control circuit performs a third sensing operation at a third time, that is after the second time, for the second category (e.g., Category 2 of FIG. 11). In step 1308, the control circuit performs a fourth sensing operation at a fourth time, that is after the third time, for the second category. Thus, there are four sensing operations being performed for a same data state. For example, while applying one read compare voltage, four sensing operations are performed. The four sensing operations can be to sense four soft bits, or to sense two hard bits and two soft bits (1 hard bit and one soft bit for each category). The process of FIG. 13 is an example of selected non-volatile memory cell being sensed two different times, selected non-volatile memory cells classified into a same category are sensed at a same time and selected non-volatile memory cells classified into different categories are sensed at different times in response to the first word line voltage applied to the selected word line.

Figure 14:
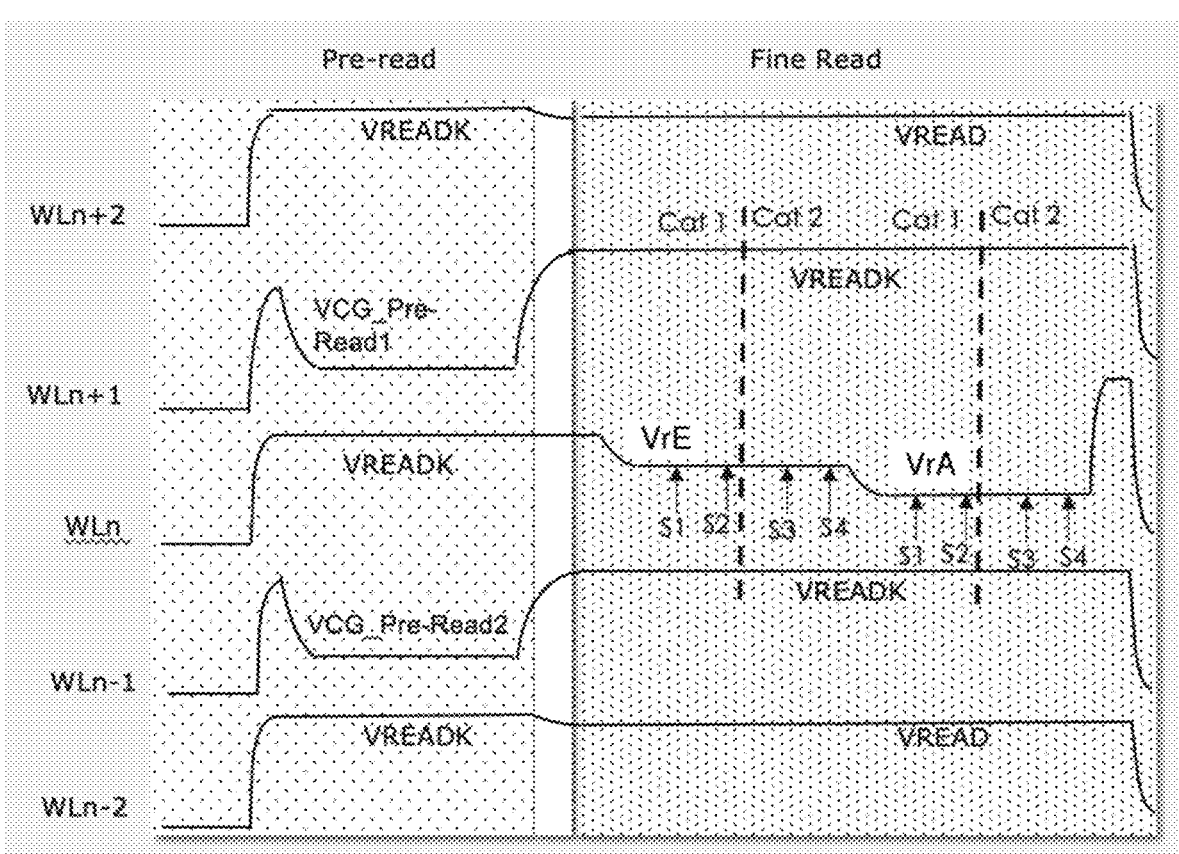
FIG. 14 is a timing diagram describing sensing at different sense times.

FIG. 14 is a timing diagram that explains the embodiment of FIG. 13 in conjunction with FIG. 10. FIG. 14 shows the voltages applied to selected word line WLn, the neighbor word lines WLn−1 and WLn+1, and non-neighbor word lines WLn−2 and WLn+2. The portion of FIG. 14 labeled "Pre-Read" represents the pre-read sensing of step 1002 during which the selected word line WLn and the non-neighbor word lines WLn−2 and WLn+2 receive VreadK (e.g., ~6.6 v), while WLn+1 receives VCG_Pre-Read1 and WLn−1 receives VCG_Pre-Read2. In one embodiment, VCG_Pre-Read1 is equal to VCG_Pre-Read2. In another embodiment, VCG_Pre-Read1 is higher or lower than VCG_Pre-Read2. In one set of embodiments, VCG_Pre-Read1 and VCG_Pre-Read2 are set to a voltage level that enables the system to sense whether the threshold voltage of the neighbor memory cells are lower or higher than a reference level. For example, VCG_Pre-Read1 and VCG_Pre-Read2 are both set to VrE (or another voltage) in order to determine whether each neighbor memory cell is in a low threshold voltage data state (e.g., Er, A, B, C, D) or a high threshold voltage data state (e.g., E, F. G). Because the system is only determining whether the neighbor memory cells are in a low threshold voltage data state or a high threshold voltage data, only a single pre-read sensing operation can be concurrently performed for all neighbor memory cells on both neighbor word lines.

The portion of FIG. 14 labeled as "Fine Read" represents steps 1006 and 1008 of FIG. 10, where step 1008 comprises performing the process of FIG. 13. The neighbor word lines (WLn−1 and WLn+1) and the non-neighbor word lines (WLn−2 and WLn+2) receive Vread (e.g., ~6 v). Vread and VreadK are examples of overdrive voltages that are higher than any expected threshold voltage such that they will cause all memory cells connected to the word line to turn on regardless of the data being stored. The selected word line first receives read compare voltage VrE and then is lowered to read compare voltage VrA. Referring back to Table 2 and the embodiment that stores three bits of data in each memory cell in three pages, the lower page can be read by sensing at VrE and VrA; the middle page can be read by sensing at VrF, VrD and VrB; and the upper page can be read by sensing at VrC and VrG. FIG. 14 shows the example of reading the lower page; therefore, VrE and VrA are applied to the selected word line WLn. FIG. 14 shows sensing for the embodiment that implements Category 1 (Cat 1) and Category 2 (Cat 2) of FIG. 11. In other embodiments, more than two categories can be implemented. While VrE is applied to the selected word line WLn the control circuit performs two sensing operations for each category including a first sensing operation S1 at a first time for Category 1 (step 1302), second sensing operation S2 at a second time that is after the first time for Category 1 (step 1304), a third sensing operation S3 at a third time that is after the second time for Category 2 (step 1306), and a fourth sensing operation S4 at a fourth time that is after the third time for Category 2 (step 1308). While VrA is applied to the selected word line WLn the control circuit performs two sensing operations for each category including a first sensing operation S1 at a first time for Category 1 (step 1302), second sensing operation S2 at a second time that is after the first time for Category 1 (step 1304), a third sensing operation S3 at a third time that is after the second time for Category 2 (step 1306), and a fourth sensing operation S4 at a fourth time that is after the third time for Category 2 (step 1308). In one embodiment, sensing operation S1 senses a hard bit for Category 1 memory cells, sensing operation S2 senses a soft bit for Category 1 memory cells, sensing operation S3 sense a hard bit for Category 2 memory cells, and sensing operation S4 sense a soft bit for Category 2 memory cells.

The process of FIG. 14 is an example of selected non-volatile memory cell being sensed two different times (either S1/S2 or S3/S4), selected non-volatile memory cells classified into a same category are sensed at a same time (Category 1 memory cells are sensed at S1 and S2, Category 2 memory cells are sensed at S3 and S4), and selected non-volatile memory cells classified into different categories are sensed at different times in response to the word line voltage applied to the selected word line (Category 1 memory cells are sensed at S1 and S2 while Category 2 memory cells are sensed at S3 and S4). Thus, FIG. 14 shows two sensing operations for the programmed data state on selected memory cells that have neighbor memory cells on the neighbor word lines in a first condition (two respective neighbor memory cells in low threshold voltage data states) and two sensing operations for the programmed data state on selected memory cells that have neighbor memory cells on the neighbor word lines in a second condition (at least one respective neighbor memory cell in a high threshold voltage data state).

Figure 15:
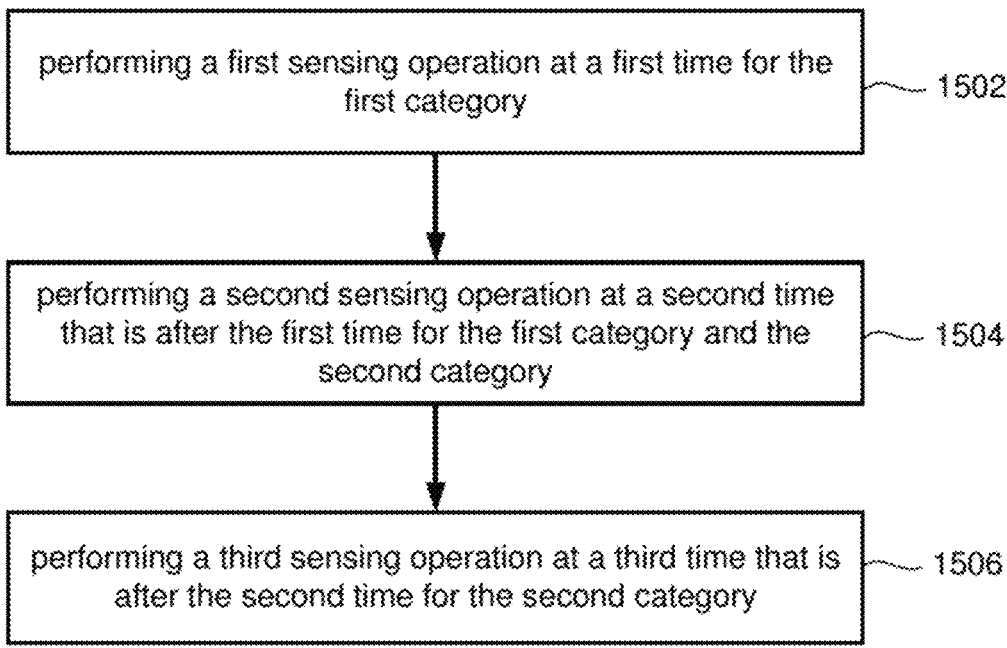
FIG. 15 is a flow chart describing one embodiment of a process for sensing at different sense times.

FIG. 15 is a flow chart describing another embodiment of a process for performing two sensing operations for each category in an example implementation that uses the two categories of FIG. 11. Thus, the process of FIG. 15 is performed during step 1008 of FIG. 10. In one example implementation, the process of FIG. 15 can be performed by any one of the one or more control circuits discussed above. The process of FIG. 15 can be performed entirely by a control circuit on memory die 200 (see FIG. 2A) or entirely by a control circuit on integrated memory assembly 207 (see FIG. 2B), rather than by memory controller 120. In one example, the process of FIG. 15 is performed by or at the direction of state machine 262, using other components of System Control Logic 260, Column Control Circuitry 210 and Row Control Circuitry 220.

In step 1502, the control circuit performs a first sensing operation at a first time for the first category. In step 1504, the control circuit performs a second sensing operation at a second time that is after the first time for the first category and the second category. In step 1506, the control circuit performs a third sensing operation at a third time that is after the second time for the second category. Thus, there are three sensing operations being performed for a same data state. For example, while applying one read compare voltage three sensing operations are performed. The second sensing operation senses for both Category 1 memory cells and Category 2 memory cells. The process of FIG. 13 is an example of selected non-volatile memory cell being sensed two different times, selected non-volatile memory cells classified into a same category are sensed at a same time and selected non-volatile memory cells classified into different categories are sensed at one or more different times in response to the first word line voltage applied to the selected word line.

Figure 16:
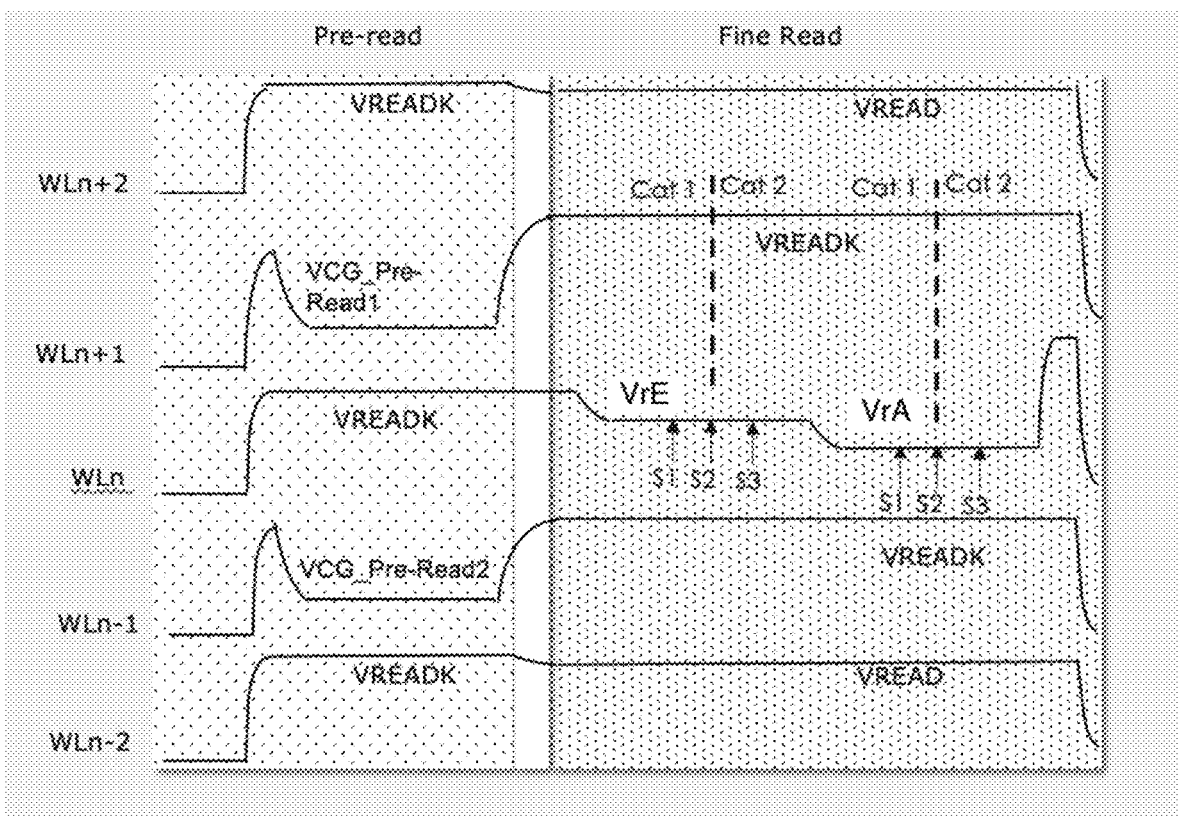
FIG. 16 is a timing diagram describing sensing at different sense times.

FIG. 16 is a timing diagram that explains the embodiment of FIG. 15 in conjunction with FIG. 10. FIG. 16 shows the voltages applied to selected word line WLn, the neighbor word lines WLn−1 and WLn+1, and non-neighbor word lines WLn−2 and WLn+2. The portion of FIG. 16 labeled "Pre-Read" represents the pre-read sensing of step 1002 and is the same as FIG. 14.

The portion of FIG. 16 labeled as "Fine Read" represents steps 1006 and 1008 of FIG. 10, where step 1008 comprises performing the process of FIG. 15. The neighbor word lines (WLn−1 and WLn+1) and the non-neighbor word lines (WLn−2 and WLn+2) receive Vread (e.g., ~6v). The selected word line first receives VrE and then is lowered to VrA. While VrE is applied to the selected word line WLn the control circuit performs two sensing operations for each category including a first sensing operation S1 at a first time for Category 1 (step 1502), a second sensing operation S2 at a second time that is after the first time for Category 1 and Category 2 (step 1504), and a third sensing operation S3 at a third time that is after the second time for Category 2 (step 1506). While VrA is applied to the selected word line WLn the control circuit performs two sensing operations for each category including a first sensing operation S1 at a first time for Category 1 (step 1502), a second sensing operation S2 at a second time that is after the first time for Category 1 and Category 2 (step 1504), and a third sensing operation S3 at a third time that is after the second time for Category 2 (step 1506). In one embodiment, sensing operation S1 senses a hard bit for Category 1 memory cells, sensing operation S2 senses a soft bit for Category 1 memory cells and a hard bit for Category 2 memory cells, and sensing operation S3 sense a soft bit for Category 2 memory cells.

The process of FIG. 16 is an example of selected non-volatile memory cell being sensed two different times (either S1/S2 or S2/S3), selected non-volatile memory cells classified into a same category are sensed at a same time (Category 1 memory cells are sensed at S1 and S2, Category 2 memory cells are sensed at S2 and S3), and selected non-volatile memory cells classified into different categories are sensed at one or more different times in response to the same word line voltage applied to the selected word line (Category 1 memory cells are sensed at S1 while Category 2 memory cells are sensed at S3). Thus, FIG. 16 shows two sensing operations for the programmed data state on selected memory cells that have neighbor memory cells on the neighbor word lines in a first condition (two respective neighbor memory cells in low threshold voltage data states) and two sensing operations for the programmed data state on selected memory cells that have neighbor memory cells on the neighbor word lines in a second condition (at least one respective neighbor memory cell in a high threshold voltage data state).

Figure 17:
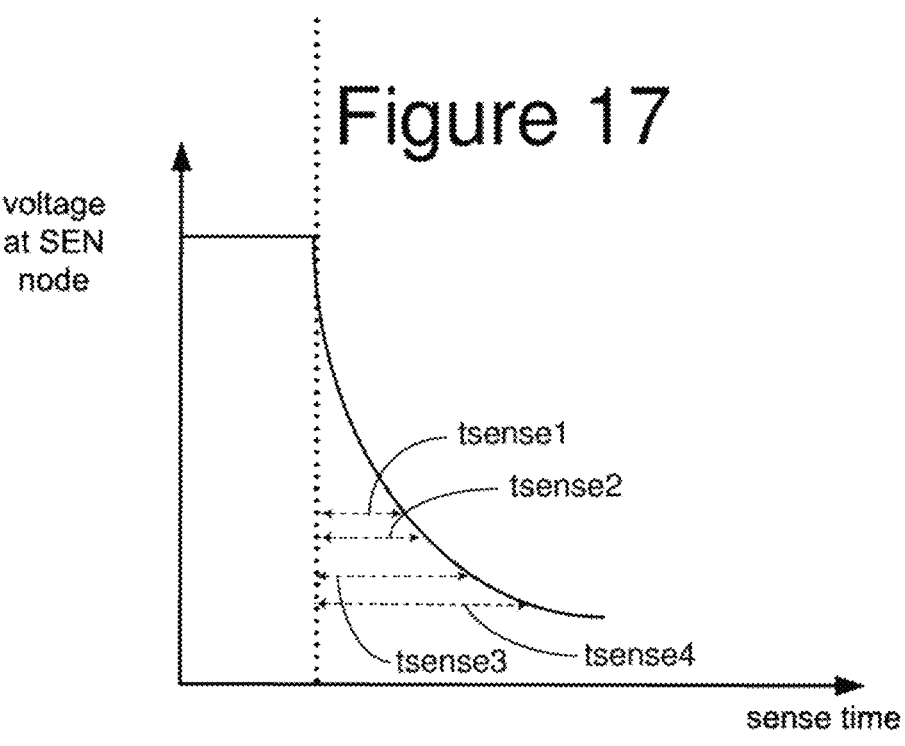
FIG. 17 is a graph depicting the voltage at the SEN node of the sense amplifier.

FIG. 17 is a graph depicting the voltage at the SEN node of the sense amplifier (see FIG. 7) versus time during a sensing process. FIG. 17 shows four sense times tsense1, tsense 2, tsense 3 and tsense 4. Sense time tsense1 corresponds to S1 of FIG. 14. Sense time tsense2 corresponds to S2 of FIG. 14. Sense time tsense3 corresponds to S3 of FIG. 14. Sense time tsense4 corresponds to S4 of FIG. 14. In another embodiment, tsense1 corresponds to S1 of FIG. 16, tsense2 corresponds to S2 of FIG. 16 and tsense3 corresponds to S3 of FIG. 16.

Figure 18:
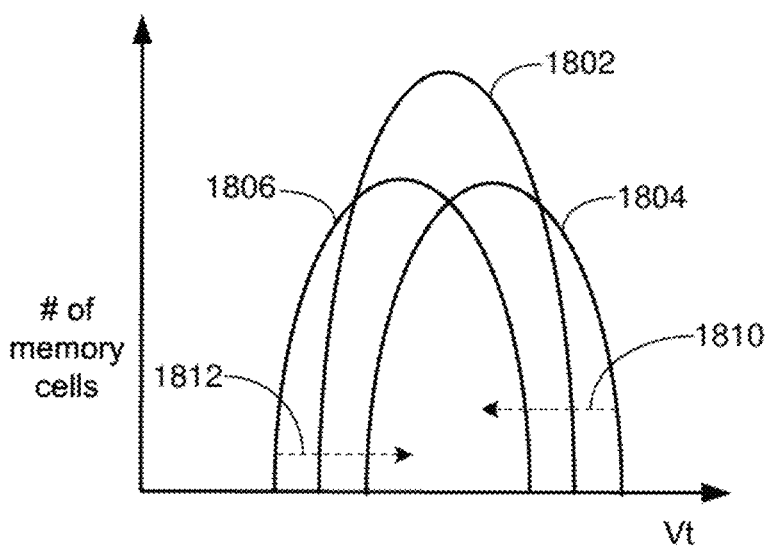
FIG. 18 depicts threshold voltage distributions.

FIG. 18 depicts how the adjusting of sense times serves to make the threshold voltage distribution of memory cells appear to be narrower. Threshold voltage distribution 1804 represents memory cells in Category 2. Threshold voltage distribution 1806 represents memory cells in Category 1. Memory cells in Category 2 appear to have threshold voltages that are higher than memory cells in Category 1 because the neighbor memory cells for memory cells in Category 2 are in a higher threshold voltage data state. Using shorter sense times for Category 1 memory cells make the threshold voltage of the Category 1 memory cells appear higher, as represented by arrow 1812 and using longer sense times for Category 2 memory cells make the threshold voltage of the Category 2 memory cells appear lower, as represented by arrow 1810, causing threshold voltage distribution 1804 to merge with threshold voltage distribution 1806 to form narrower threshold voltage distribution 1802. Narrower threshold voltage distributions can be read with less errors. Using different sense times in response to a same word line voltage is much faster than performing multiple sense operations in response to different word lines voltages.

A system has been proposed that performs a high reliability read process at a faster speed.

One embodiment includes a non-volatile storage apparatus, comprising: a non-volatile memory structure including non-volatile memory cells and word lines connected to the non-volatile memory cells and a control circuit connected to the non-volatile memory structure. The control circuit is configured to: classify each selected non-volatile memory cell of a set of selected non-volatile memory cells connected to a selected word line into a category of a set of two or more categories based on condition of one or more respective neighbor non-volatile memory cells, apply a first word line voltage to the selected word line, and perform two sensing operations for each category of the set of two or more categories while applying the first word line voltage to the selected word line in order to read the set of selected non-volatile memory cells such that each selected non-volatile memory cell is sensed two different times. Selected non-volatile memory cells classified into a same category are sensed at a same time and selected non-volatile memory cells classified into different categories are sensed at one or more different times in response to the first word line voltage applied to the selected word line.

In one example implementation, the control circuit is further configured to perform a pre-read sensing operation to determine conditions of neighbor memory cells connected to neighbor word lines, the neighbor word lines are adjacent to the selected word line, the control circuit is configured to classify each selected non-volatile memory cell of the set of selected non-volatile memory cells into a category of the set of two or more categories based on condition of one or more respective neighbor non-volatile memory cells sensed during the pre-read sensing operation.

In one example implementation, the control circuit is further configured to perform a single pre-read sensing operation to determine conditions of neighbor memory cells connected to two neighbor word lines, the neighbor word lines are adjacent to the selected word line, the control circuit is configured to classify each selected non-volatile memory cell of the set of selected non-volatile memory cells into a category of the set of two or more categories based on condition of one or more respective neighbor non-volatile memory cells sensed during the single pre-read sensing operation.

In one example implementation, the control circuit is further configured to perform a single pre-read sensing operation to determine conditions of neighbor memory cells connected to two neighbor word lines, the neighbor word lines are adjacent to the selected word line, the single pre-read sensing operation identifies whether each neighbor memory cell is in a low threshold voltage data state or a high threshold voltage data state, the control circuit is configured to classify selected non-volatile memory cells of the set of selected non-volatile memory cells into a first category if two respective neighbor memory cells are identified to be in the low threshold voltage data state, the control circuit is configured to classify selected non-volatile memory cells of the set of selected non-volatile memory cells into a second category if at least one respective neighbor memory cell is identified to be in the high threshold voltage data state.

In one example implementation, the set of two or more categories comprises a first category and a second category; and the control circuit is configured to perform two sensing operations for each category of the set of two or more categories in response to the first word line voltage applied to the selected word line by first performing a first sensing operation at a first time for the first category, a second sensing operation at a second time that is after the first time for the first category, a third sensing operation at a third time that is after the second time for the second category, and a fourth sensing operation at a fourth time that is after the third time for the second category.

In one example implementation, the set of two or more categories comprises a first category and a second category; and the control circuit is configured to perform two sensing operations for each category of the set of two or more categories in response to the first word line voltage applied to the selected word line by first performing a first sensing operation at a first time for the first category, a second sensing operation at a second time that is after the first time for the first category and the second category, and a third sensing operation at a third time that is after the second time for the second category.

In one example implementation, wherein the control circuit is further configured to determine data being stored in the set of selected memory cells based on the two sensing operations for each category.

In one example implementation, the control circuit includes a memory controller; and the memory controller is configured to determine data being stored in the set of selected memory cells based on the two sensing operations for each category.

In one example implementation, the control circuit includes a memory controller; the two sensing operations for each category identifies two bits of data per memory cell per programmed data state, at least one bit of each two bits of data per memory cell per programmed data state is a soft bit; and the memory controller is configured to determine data being stored in the set of selected memory cells based on the two bits of data per memory cell per programmed data state.

In one example implementation, the control circuit is configured to perform the two sensing operations for each category of the set of two or more categories for each of multiple programmed data states.

In one example implementation, the set of selected memory cells each store multiple bits of data in multiple pages; and the control circuit is configured to perform the two sensing operations for each category of the set of two or more categories for each of multiple programmed data states to determine data being stored in one page of the set of selected memory cells.

One embodiment includes a non-volatile storage apparatus, comprising: a non-volatile memory structure including non-volatile memory cells and word lines connected to the non-volatile memory cells and a control circuit connected to the non-volatile memory structure. The control circuit is configured to perform a pre-read sensing operation to determine conditions of neighbor memory cells connected to neighbor word lines, the neighbor word lines are adjacent to a selected word line, a set of selected memory cells are connected to the selected word line, apply a first word line voltage associated with a first programmed data state to the selected word line, perform two sensing operations for the first programmed data state on selected memory cells that have neighbor memory cells on the neighbor word lines in a first condition, perform two sensing operations for the first programmed data state on selected memory cells that have neighbor memory cells on the neighbor word lines in a second condition, and determine data being stored in the set of selected memory cells based on the two sensing operations for the first programmed data state on selected memory cells that have neighbor memory cells on the neighbor word lines in the first condition and the two sensing operations for the first programmed data state on selected memory cells that have neighbor memory cells on the neighbor word lines in the second condition.

In one example implementation, the first condition comprises two respective neighbor memory cells in low threshold voltage data states; and the second condition comprises at least one respective neighbor memory cell in a high threshold voltage data state.

In one example implementation, the control circuit is configured to perform a single pre-read sensing operation to determine conditions of neighbor memory cells connected to two neighbor word lines, the single pre-read sensing operation identifies whether each neighbor memory cell is in a low threshold voltage data state or a high threshold voltage data state, the first condition comprises two respective neighbor memory cells in low threshold voltage data states, the second condition comprises at least one respective neighbor memory cell in a high threshold voltage data state.

In one example implementation, the control circuit is configured to perform two sensing operations for the first programmed data state on selected memory cells that have neighbor memory cells on the neighbor word lines in the first condition and perform two sensing operations for the first programmed data state on selected memory cells that have neighbor memory cells on the neighbor word lines in the second condition by first performing a first sensing operation at a first time for the selected memory cells that have neighbor memory cells in the first condition, second performing a second sensing at a second time after the first time for the selected memory cells that have neighbor memory cells in the first condition and for the selected memory cells that have neighbor memory cells in the second condition, and a third sensing operation at a third time that is after the second time for the selected memory cells that have neighbor memory cells on the neighbor word lines in the second condition In one example implementation, the set of selected memory cells each store multiple bits of data in multiple pages; and the control circuit is configured to perform two sensing operations for the first programmed data state on selected memory cells that have neighbor memory cells on the neighbor word lines in the first condition and perform two sensing operations for the first programmed data state on selected memory cells that have neighbor memory cells on the neighbor word lines in the second condition to determine data being stored in one page of the set of selected memory cells.

One embodiment includes a method, comprising: performing a sensing operation for memory cells connected to one or more neighbor word lines, the neighbor word lines are adjacent to a selected word line for reading; classifying each selected memory cell of a set of selected memory cells connected to the selected word line into a category of a set of two or more categories based on the sensing operation for memory cells connected to one or more neighbor word lines; applying a first word line voltage associated with a first programmed data state to the selected word line; performing two or more sensing operations for each category for the first programmed data state; and determining data being stored in the set of selected memory cells based on the two or more sensing operations for each category for the first programmed data state.

In one example implementation, the performing the sensing operation for memory cells connected to one or more neighbor word lines comprises performing a single pre-read sensing operation to determine conditions of neighbor memory cells connected to two neighbor word lines, the single pre-read sensing operation identifies whether each neighbor memory cell is in a low threshold voltage data state or a high threshold voltage data state; and the classifying comprises classifying selected non-volatile memory cells of the set of selected non-volatile memory cells into a first category if two respective neighbor memory cells are identified to be in low threshold voltage data states and classifying selected non-volatile memory cells of the set of selected non-volatile memory cells into the second condition if at least one respective neighbor memory cell is identified to be in a high threshold voltage data state.

In one example implementation, the two sensing operations for each category identifies two bits of data per memory cell per programmed data state, at least one bit of each two bits of data per memory cell per programmed data state is a soft bit; and the determining is performed by a memory controller based on the two bits of data per memory cell per programmed data state.

One example implementation further comprises performing two or more sensing operations for each category for the additional programmed data states.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
   a non-volatile memory structure including non-volatile memory cells and word lines connected to the non-volatile memory cells; and
   a control circuit connected to the non-volatile memory structure, the control circuit is configured to:
      classify each selected non-volatile memory cell of a set of selected non-volatile memory cells connected to a selected word line into a category of a set of two or more categories based on condition of two respective neighbor non-volatile memory cells,
      apply a first word line voltage to the selected word line, and
      perform two sensing operations for each category of the set of two or more categories while applying the first word line voltage to the selected word line in order to read the set of selected non-volatile memory cells such that each selected non-volatile memory cell is sensed two different times, selected non-volatile memory cells classified into a same category are sensed at a same time and selected non-volatile memory cells classified into different categories are sensed at one or more different times in response to the first word line voltage applied to the selected word line, the two sensing operations for each category include a sensing operation for a hard bit of data and a sensing operation for a soft bit of data.

2. The non-volatile storage apparatus of claim 1, wherein the control circuit is further configured to:
   perform a pre-read sensing operation to determine conditions of neighbor memory cells connected to neighbor word lines, the neighbor word lines are adjacent to the selected word line, the control circuit is configured to classify each selected non-volatile memory cell of the set of selected non-volatile memory cells into a category of the set of two or more categories based on condition of two respective neighbor non-volatile memory cells sensed during the pre-read sensing operation.

3. The non-volatile storage apparatus of claim 1, wherein the control circuit is further configured to:
   perform a single pre-read sensing operation to determine conditions of neighbor memory cells connected to two neighbor word lines, the neighbor word lines are adjacent to the selected word line, the control circuit is configured to classify each selected non-volatile memory cell of the set of selected non-volatile memory cells into a category of the set of two or more categories based on condition of two respective neighbor non-volatile memory cells sensed during the single pre-read sensing operation.

4. The non-volatile storage apparatus of claim 1, wherein the control circuit is further configured to:
   perform a single pre-read sensing operation to determine conditions of neighbor memory cells connected to two neighbor word lines, the neighbor word lines are adjacent to the selected word line, the single pre-read sensing operation identifies whether each neighbor memory cell is in a low threshold voltage data state or a high threshold voltage data state, the control circuit is configured to classify selected non-volatile memory cells of the set of selected non-volatile memory cells into a first category if two respective neighbor memory cells are identified to be in the low threshold voltage data state, the control circuit is configured to classify selected non-volatile memory cells of the set of selected non-volatile memory cells into a second category if at least one respective neighbor memory cell is identified to be in the high threshold voltage data state.

5. The non-volatile storage apparatus of claim 1, wherein: the set of two or more categories comprises a first category and a second category; and the control circuit is configured to perform two sensing operations for each category of the set of two or more categories in response to the first word line voltage applied to the selected word line by first performing a first sensing operation at a first time for the first category, a second sensing operation at a second time that is after the first time for the first category, a third sensing operation at a third time that is after the second time for the second category, and a fourth sensing operation at a fourth time that is after the third time for the second category.

6. The non-volatile storage apparatus of claim 1, wherein: the set of two or more categories comprises a first category and a second category; and the control circuit is configured to perform two sensing operations for each category of the set of two or more categories in response to the first word line voltage applied to the selected word line by first performing a first sensing operation at a first time for the first category, a second sensing operation at a second time that is after the first time for the first category and the second category, and a third sensing operation at a third time that is after the second time for the second category.

7. The non-volatile storage apparatus of claim 1, wherein the control circuit is further configured to:

determine data being stored in the set of selected memory cells based on the two sensing operations for each category.

8. The non-volatile storage apparatus of claim 1, wherein: the control circuit includes a memory controller;

the two sensing operations for each category identifies two bits of data per memory cell per programmed data state, at least one bit of each two bits of data per memory cell per programmed data state is a soft bit; and the memory controller is configured to determine data being stored in the set of selected memory cells based on the two bits of data per memory cell per programmed data state.

9. The non-volatile storage apparatus of claim 1, wherein: the set of selected memory cells each store multiple bits of data in multiple pages; and the control circuit is configured to perform the two sensing operations for each category of the set of two or more categories for each of multiple programmed data states to determine data being stored in one page of the set of selected memory cells.

10. The non-volatile storage apparatus of claim 1, wherein the control circuit is further configured to:

perform at least three sensing operations while applying the first word line voltage to the selected word line, the performing at least three sensing operations includes the performing of the two or more sensing operations for each category of the set of two or more categories.

11. A non-volatile storage apparatus, comprising:

a non-volatile memory structure including non-volatile memory cells and word lines connected to the non-volatile memory cells; and a control circuit connected to the non-volatile memory structure, the control circuit is configured to:

perform a pre-read sensing operation to determine conditions of neighbor memory cells connected to neighbor word lines, the neighbor word lines are adjacent to a selected word line, a set of selected memory cells are connected to the selected word line, apply a first word line voltage associated with a first programmed data state to the selected word line, while applying the first word line voltage, perform two sensing operations for the first programmed data state on selected memory cells that have neighbor memory cells on the neighbor word lines in a first condition, the two sensing operations include a sensing operation for a hard bit of data and a sensing operation for a soft bit of data for selected memory cells that have neighbor memory cells on the neighbor word lines in the first condition, while applying the first word line voltage, perform two sensing operations for the first programmed data state on selected memory cells that have neighbor memory cells on the neighbor word lines in a second condition, the two sensing operations include a sensing operation for a hard bit of data and a sensing operation for a soft bit of data for selected memory cells that have neighbor memory cells on the neighbor word lines in the first condition, and determine data being stored in the set of selected memory cells based on the two sensing operations for the first programmed data state on selected memory cells that have neighbor memory cells on the neighbor word lines in the first condition and the two sensing operations for the first programmed data state on selected memory cells that have neighbor memory cells on the neighbor word lines in the second condition.

12. The non-volatile storage apparatus of claim 11, wherein:

the first condition comprises two respective neighbor memory cells in low threshold voltage data states; and the second condition comprises at least one respective neighbor memory cell in a high threshold voltage data state.

13. The non-volatile storage apparatus of claim 11, wherein the control circuit is configured to:

perform a single pre-read sensing operation to determine conditions of neighbor memory cells connected to two neighbor word lines, the single pre-read sensing operation identifies whether each neighbor memory cell is in a low threshold voltage data state or a high threshold voltage data state, the first condition comprises two respective neighbor memory cells in low threshold voltage data states, the second condition comprises at least one respective neighbor memory cell in a high threshold voltage data state.

14. The non-volatile storage apparatus of claim 11, wherein:

the control circuit is configured to perform two sensing operations for the first programmed data state on selected memory cells that have neighbor memory cells on the neighbor word lines in the first condition and perform two sensing operations for the first programmed data state on selected memory cells that have neighbor memory cells on the neighbor word lines in the second condition by first performing a first sensing operation at a first time for the selected memory cells that have neighbor memory cells in the first condition, second performing a second sensing at a second time after the first time for the selected memory cells that have neighbor memory cells in the first condition and for the selected memory cells that have neighbor memory cells in the second condition, and a third sensing operation at a third time that is after the second time for the selected memory cells that have neighbor memory cells on the neighbor word lines in the second condition.

15. The non-volatile storage apparatus of claim 11, wherein:

the control circuit is further configured to perform a pre-read sensing operation to determine conditions of neighbor memory cells connected to neighbor word lines by performing sensing operations for two neighbor memory cells.

16. A method, comprising:

performing a sensing operation for memory cells connected to one or more neighbor word lines, the neighbor word lines are adjacent to a selected word line for reading;

classifying each selected memory cell of a set of selected memory cells connected to the selected word line into a category of a set of two or more categories based on the sensing operation for memory cells connected to one or more neighbor word lines;

applying a first word line voltage associated with a first programmed data state to the selected word line;

performing at least three sensing operations while applying the first word line voltage including performing two or more sensing operations for each category for the first programmed data state; and determining data being stored in the set of selected memory cells based on the two or more sensing operations for each category for the first programmed data state.

17. The method of claim 16, wherein:

the performing the sensing operation for memory cells connected to one or more neighbor word lines comprises performing a single pre-read sensing operation to determine conditions of neighbor memory cells connected to two neighbor word lines, the single pre-read sensing operation identifies whether each neighbor memory cell is in a low threshold voltage data state or a high threshold voltage data state; and the classifying comprises classifying selected non-volatile memory cells of the set of selected non-volatile memory cells into a first category if two respective neighbor memory cells are identified to be in low threshold voltage data states and classifying selected non-volatile memory cells of the set of selected non-volatile memory cells into the second condition if at least one respective neighbor memory cell is identified to be in a high threshold voltage data state.

18. The method of claim 16, wherein:

the two sensing operations for each category include a sensing operation for a hard bit of data and a sensing operation for a soft bit of data for selected memory cells.

19. The method of claim 16, wherein:

the performing the sensing operation for memory cells connected to one or more neighbor word lines compromise performing the sensing operation for memory cells connected to two neighbor word lines.

* * * * *